(12) United States Patent
Fantner et al.

(10) Patent No.: US 10,308,500 B2
(45) Date of Patent: Jun. 4, 2019

(54) MULTILAYER MEMS CANTILEVERS

(71) Applicant: ECOLE POLYTECHNIQUE FEDERALE DE LAUSANNE (EPFL), Lausanne (CH)

(72) Inventors: Georg Ernest Fantner, Chavannes-Renens (CH); Jonathan David Adams, Lausanne (CH); Nahid Hosseini, Ecublens (CH)

(73) Assignee: ECOLE POLYTECHNIQUE FEDERALE DE LAUSANNE (EPFL), Lausanne (CH)

( * ) Notice: Subject to any disclaimer, the term of this patent is extended or adjusted under 35 U.S.C. 154(b) by 82 days.

(21) Appl. No.: 15/574,980

(22) PCT Filed: May 23, 2016

(86) PCT No.: PCT/IB2016/053013
§ 371 (c)(1),
(2) Date: Nov. 17, 2017

(87) PCT Pub. No.: WO2016/189451
PCT Pub. Date: Dec. 1, 2016

(65) Prior Publication Data
US 2018/0141801 A1 May 24, 2018

(30) Foreign Application Priority Data
May 22, 2015 (WO) .................. PCT/IB2015/053769

(51) Int. Cl.
*B81B 3/00* (2006.01)
*G01Q 60/24* (2010.01)
(Continued)

(52) U.S. Cl.
CPC .......... *B81B 3/0045* (2013.01); *B81B 3/0078* (2013.01); *B81C 1/0015* (2013.01);
(Continued)

(58) Field of Classification Search
USPC .......................... 850/1, 2, 29, 40, 45, 48, 58
See application file for complete search history.

(56) References Cited

U.S. PATENT DOCUMENTS 5,389,475 A * 2/1995 Yanagisawa ............. G11B 9/14
250/307
9,107,605 B2 * 8/2015 Boyle .................... A61B 5/076
(Continued)

FOREIGN PATENT DOCUMENTS

CN 104155478 11/2014

OTHER PUBLICATIONS

International Search Report and Written Opinion prepared by the European Patent Office dated Aug. 30, 2016, for International Application No. PCT/IB2016/053013.
(Continued)

*Primary Examiner* — Bernard Souw
(74) *Attorney, Agent, or Firm* — Sheridan Ross P.C.

(57) ABSTRACT

The present invention relates to a cantilever or membrane comprising a body and an elongated beam attached to the body. The elongated beam includes a first layer comprising a first material, a second layer comprising a second material having an elastic modulus different to that of the first material, a third layer comprising a third material having an elastic modulus different to that of the first material, where the first layer is sandwiched between the second layer and the third layer.

17 Claims, 31 Drawing Sheets

(51) Int. Cl.
*G01Q 60/38* (2010.01)
*B81C 1/00* (2006.01)
*G01Q 70/14* (2010.01)
*G01Q 20/04* (2010.01)

(52) U.S. Cl.
CPC ......... *B81C 1/00682* (2013.01); *G01Q 60/38* (2013.01); *G01Q 70/14* (2013.01); *B81B 2201/12* (2013.01); *B81B 2203/0118* (2013.01); *B81C 2201/014* (2013.01); *G01Q 20/04* (2013.01)

(56) References Cited

U.S. PATENT DOCUMENTS

| 9,752,247 | B2* | 9/2017 | Cohen | B81C 1/00126 |
|---|---|---|---|---|
| 2012/0260374 | A1* | 10/2012 | McConney | B82Y 35/00 850/1 |
| 2014/0366230 | A1 | 12/2014 | Wang et al. | |

OTHER PUBLICATIONS

Adams et al. "Analysis of local deformation effects in resistive strain sensing of a submicron-thickness AFM cantilever," Proceedings of SPIE Microtechnologies, Smart Sensors, Actuators, and MEMS IV, 2013, vol. 8763, 876327, 9 pages.
Albrecht et al. "Microfabrication of cantilever styli for the atomic force microscope," Journal of Vacuum Science & Technology A, Jul./Aug. 1990, vol. 8, No. 4, pp. 3386-3396.
Ando et al. "A high-speed atomic force microscope for studying biological macromolecules," PNAS, Oct. 2001, vol. 98, No. 22, pp. 12468-124742.
Ayela et al. "Resonant Microcantilevers for the Determination of the Loss Modulus of Thin Polymer Films," Journal of Microelectromechanical Systems, Aug. 2011, vol. 20, No. 4, pp. 788-790.
Brugger et al. "Microlever with combined integrated sensor/actuator functions for scanning force microscopy," Sensors and Actuators A, 1994, vol. 43, pp. 339-345.
Burt et al. "A simple method for high yield fabrication of sharp silicon tips," Microelectronic Engineering, 2008, vol. 85, pp. 625-630.
Calleja et al. "Highly sensitive polymer-based cantilever-sensors for DNA detection," Ultramicroscopy, 2005, vol. 105, pp. 215-222.
Casuso et al. "Characterization of the motion of membrane proteins using high-speed atomic force microscopy," Nature Nanotechnology, Aug. 2012, vol. 7, pp. 525-529.
Fantner et al. "Components for high speed atomic force microscopy," Ultramicroscopy, 2006, vol. 106, pp. 881-887.
Fantner et al. "Kinetics of antimicrobial peptide activity measured on individual bacterial cells using high-speed atomic force microscopy," Nature Nanotechnology, Apr. 2010, vol. 5, pp. 280-285.
Genolet et al. "Soft, entirely photoplastic probes for scanning force microscopy," Review of Scientific Instruments, May 1999, vol. 70, No. 5, pp. 2398-2401.
Huber et al. "Direct detection of a BRAF mutation in total RNA from melanoma cells using cantilever arrays," Nature Nanotechnology, Feb. 2013, vol. 8, pp. 125-129.
Ivanov et al. "A FM cantilever with ultra-thin transistor-channel piezoresistor: quantum confinement," Microelectronic Engineering, 2003, vol. 67-68, pp. 534-541.
Ivanov et al. "Thermally driven micromechanical beam with piezoresistive deflection readout," Microelectronic Engineering, 2003, vol. 67-68, pp. 550-556.
Lee et al. "Self-excited piezoelectric PZT microcantilevers for dynamic SFM—with inherent sensing and actuating capabilities," Sensors and Actuators A, Jan. 1999, vol. 72, No. 2, pp. 179-188.
Lee et al. "Liquid Operation of Silicon Microcantilever Heaters," IEEE Sensors Journal, Nov. 2008, vol. 8, No. 11, pp. 1805-1806.
Lee et al. "Improved All-Silicon Microcantilever Heaters With Integrated Piezoresistive Sensing," Journal of Microelectromechanical Systems, Apr. 2008, vol. 17, No. 2, pp. 432-445.
Lee et al. "Electrical, Thermal, and Mechanical Characterization of Silicon Microcantilever Heaters," Journal of Microelectromechanical Systems, Dec. 2006, vol. 15, No. 6, pp. 1644-1655.
Le Rouzic et al. "Comparison of three different scales techniques for the dynamic mechanical characterization of two polymers (PDMS and SU8)," European Physical Journal: Applied Physics, EDP Sciences, 2009, vol. 48, No. 1, 33 pages.
Li et al. "Ultra-sensitive NEMS-based cantilevers for sensing, scanned probe and very high-frequency applications," Nature Nanotechnology, Feb. 2007, vol. 2, pp. 114-120.
Lin "Characterization and numerical evaluation of vibration on elastic-viscoelestic sandwich structures," Composite Structures, Feb. 2010, vol. 92, No. 3, pp. 669-675.
Linnemann et al. "Characterization of a cantilever with an integrated deflection sensor," Thin Solid Films, vol. 264, 1995, pp. 159-164.
Magonov et al. "Surface Analysis with STM and AFM: Experimental and Theoretical Aspects of Image Analysis," J. Am. Chem. Soc. 1997, vol. 119, No. 18, p. 4324.
Manalis et al. "Atomic force microscopy for high speed imaging using cantilevers with an integrated actuator and sensor," Applied Physics Letters, Feb. 1996, vol. 68, No. 6, pp. 871-873.
Mertz et al. "Regulation of a microcantilever response by force feedback," Applied Physics Letters, May 1993, vol. 62, No. 19, pp. 2344-2346.
Nordstrom et al. "SU-8 Cantilevers for Bio/chemical Sensing; Fabrication, Characterisation and Development of Novel Read-out Methods," Sensors, 2008, vol. 8, pp. 1595-1612.
Pharr et al. "Measurement of Thin Film Mechanical Properties Using Nanoindentation," MRS Bulletin, Jul. 1992, pp. 28-33.
Uchihashi et al. "High-Speed Atomic Force Microscopy Reveals Rotary Catalysis of Rotorless F1-ATPase," Science, Aug. 2011, vol. 333, pp. 755-758.
Thaysen et al. "Polymer-based stress sensor with integrated read-out," Journal of Physics D: Applied Physics, 2002, vol. 35, pp. 2698-2703.
Viani et al. "Probing protein-protein interactions in real time," Nature Structural Biology, Aug. 2000, vol. 7, No. 8, pp. 644-647.
Walters et al. "Short cantilevers for atomic force microscopy," Rev. Sci. Instrum., Oct. 1996, vol. 67, No. 10, pp. 3583-3590.
Watanabe et al. "Micro-fabricated piezoelectric cantilever for atomic force microscopy," Review of Scientific Instruments, Nov. 1996, vol. 67, No. 11, pp. 3898-3903.
Weihs et al. "Mechanical defflection of cantilever microbeams: A new technique for testing the mechanical properties of thin films," Journal of Materials Research, Sep./Oct. 1988, vol. 3, No. 5, pp. 931-942.
Xiang et al. "Plane-strain bulge test for thin films," Journal of Materials Research, Sep. 2005, vol. 20, No. 9, pp. 2361-2370.
Yang et al. "Batch-fabricated cantilever probes with electrical shielding for nanoscale dielectric and conductivity imaging," Journal of Micromechanics and Microengineering, 2012, vol. 22, 115040, 9 pages.

* cited by examiner

MULTILAYER MEMS CANTILEVERS

CROSS REFERENCE TO RELATED APPLICATIONS

This application is a national stage application under 35 U.S.C. 371 and claims the benefit of PCT Application No. PCT/IB 2016/053013 having an international filing date of 23 May 2016, which designated the United States, which PCT application claimed the benefit of International Bureau of the World Intellectual Property Organization Application No. PCT/IB2015/053769 filed 22 May 2015, the disclosure of each of which are incorporated herein by reference.

FIELD OF THE INVENTION

The present application generally relates to a cantilever or membrane, and more particularly a multilayer ATM cantilever or membrane. The present application also concerns a method for producing an elongated beam of the cantilever or membrane as well as a method for producing a cantilever or membrane.

DISCUSSION OF THE BACKGROUND ART

High Bandwidth AFM Cantilevers for Operation in Air or Vacuum

In comparison with other AFM (atomic force microscopy) imaging modes, increasing the imaging speed of AFM in dynamic modes in air or vacuum has proven especially difficult. These dynamic modes include non-contact AFM, intermittent contact AFM (tapping mode), and pulsed force or peak force modes. The reason for this difficulty is the slow dynamic response of the cantilever oscillation amplitude. When subject to a change in boundary condition, the transient response of the cantilever decays with a time constant related to its resonance frequency, $f_0$, and quality factor, Q. This time constant directly impacts the imaging bandwidth, B, of the cantilever, which is a measure of how quickly the AFM cantilever can track surface topography changes. For example, in tapping mode, in the case of a linear tip sample interaction and a cantilever driven at resonance, B takes the numerical value $B=\pi f_0/Q$.

The row marked "Low $f_0$, high Q" of FIG. 1 shows on the left a schematic of a driven oscillating cantilever with a steady state oscillation amplitude subject to a sudden increase in tip-sample distance. After some time, the cantilever reaches a new steady-state oscillation amplitude according to the new boundary conditions. The response time is linked to the cantilever resonance frequency and Q-factor, which are represented in the amplitude versus frequency drawing. Immediately to the right, we see experimental data of the deflection response time of a typical tapping-mode-in-air AFM cantilever (RTESPA, Bruker AFM Probes) subject to a sudden step increase in the drive amplitude. The corresponding resonance frequency and quality factor were measured for this cantilever with the thermal tune method. The numerical values, $f_0=347$ kHz and $Q=500$, yield a response time of order one millisecond, and a corresponding imaging bandwidth of order 1 kHz. Finally, on the right, we see an SEM image of the cantilever showing its dimensions.

Thus far, efforts to increase the cantilever bandwidth have focused on increasing the resonance frequency by reducing the cantilever dimensions (so called 'small cantilevers'). This approach, shown in the row marked "High $f_0$, high Q" in FIG. 1, has by and large been the enabling technology for state of the art high-speed AFM, producing good-quality, high-speed images even on difficult biological samples.

The higher resonance frequency reduces the response time, even with largely unchanged Q, as shown schematically on the left and experimentally on the right of the second row in FIG. 1 using a commercially-available small cantilever (FastScan A, Bruker AFM Probes). Cantilevers with widths approaching the optical diffraction limit and lengths of a few micrometres are now usable in specialized high-speed AFMs.

The fastest AFM imaging in dynamic modes has been, however, uniformly performed in a liquid environment, where the Q of the cantilever is decreased substantially by the large amount of fluid damping in liquid (in fluid, most AFM cantilevers have Q≈3). However, reaching equivalent speed performance using dynamic modes in air or vacuum, where the fluid damping is substantially lower, has yet to be shown.

The work of the inventors leading to this invention has focused on an alternate cantilever construction approach to enable cantilevers with inherently low Q. Intrinsically, Q is related to the damping of the resonator. Sources of damping include fluid (air or water), mechanical clamping losses, and internal friction—which includes both surface effects and volume effects such as thermoelastic damping or viscoelastic damping. Each of these sources contribute to the overall Q of the system, which can be expressed as a combination of the Q, associated with each individual damping source:

$$\frac{1}{Q} = \sum \frac{1}{Q_i} = \frac{1}{Q_{medium}} + \frac{1}{Q_{material}} + \frac{1}{Q_{support}} + \ldots$$

Optimizing the cantilever bandwidth through Q reduction therefore translates in practice to increasing the damping mechanisms present in the system.

AFM cantilevers that are commercially available are made out of materials with low intrinsic damping, such as crystalline silicon or silicon nitride. The Intrinsic damping coefficient (or loss coefficient) of a material $\eta_i$ is defined as the ratio of the imaginary component of the dynamic modulus E" to the real component of the dynamic modulus E', $$\eta_i = \frac{E''}{E'}.$$

FIG. 2 shows some potential cantilever materials classified by their intrinsic damping coefficient on the horizontal axis, and the square root of the ratio of the elastic modulus E to the density $\rho$, $\sqrt{(E/\rho)}$, on the vertical axis. This factor $E/\rho$ is also known as the stiffness to weight ratio. Here, the square root in this ratio $\sqrt{(E/\rho)}$ comes from the expression for the fundamental resonance frequency of a cantilever beam $$f_0 = \frac{0.56}{l^2} \sqrt{\frac{I}{A}} \sqrt{\frac{E}{\rho}}$$

factored into geometrical and materials properties terms. In the expression, l is the cantilever length, I is the second moment of area and A is the cross-sectional area of the cantilever beam. Three different classes of materials are given: crystalline or ceramic materials, metals, and polymers or elastomers. The dashed lines show constant values of the product $\eta_i\sqrt{E/\rho}$, which a measure of the bandwidth ratio $f_0/Q$ expressed in terms of materials properties. Higher values trend towards the upper left corner of the plot. By this metric, the polymers and elastomers as a class of material are roughly 3 orders of magnitude better than the crystals and ceramics.

For cantilevers made of materials with very low damping coefficient, such as silicon or silicon nitride, the primary damping source is thus the air damping, which leads to cantilever with $Q \approx 500$ in air as shown in the row marked "Low $f_0$, high Q" of FIG. 1.

If the cantilever is made out of a material that exhibits large intrinsic damping, the material damping dominates the cantilever response. The total number of oscillation cycles needed to reach steady state in this case is decreased, and so the response time is decreased, even though the frequency of oscillation may be unchanged.

Of the various classes of materials that can be used to microfabricate cantilevers, polymers in particular can exhibit large intrinsic damping through viscoelastic effects, making them ideal materials for this application. Shown in the row "Low $f_0$, low Q" in FIG. 1 is a cantilever designed to maintain similar resonance frequency and spring constant as a standard tapping mode in air cantilever, but with a drastically lower Q. The cantilever is made out of a photosensitive polymer (SU-8), which has previously been demonstrated as a promising low-cost, low spring constant cantilever microfabrication material for both AFM imaging and cantilever-based biosensing. The experimental data show that the cantilever, which has a Q=21, has a similar response to a change in boundary condition to the commercial small cantilever (row marked "High $f_0$, high Q" of FIG. 1), even though the size and resonance frequency of the SU-8 cantilever is comparable to a standard cantilever (and is useable in standard AFM systems).

These two approaches, high resonance frequency and low quality factor, can be combined by reducing the dimensions of the cantilever and making a small cantilever out of a viscoelastic material. The row marked "High $f_0$, low Q" in FIG. 1 illustrates this combination. The resulting cantilever, which has a resonance frequency similar to the commercial small cantilever and a Q similar to the large SU-8 cantilever, has a response time that appears almost instantaneous on the timescale shown.

The inventors performed high-speed AFM imaging using these small SU-8 cantilevers in a customized AFM for high-speed operation. The scratched mica surface we imaged has sharp step edges, which are a difficult feature for topography feedback.

FIG. 3a shows images of the same imaging area at line scan rates from 43 Hz up to 166 Hz. The highest scan rate corresponds to scan speeds in excess of 1 image/s and a linear tip speed over the surface of 1953 µm/s. The height images (left of FIG. 3a) appear identical at all scan rates, apart from more pixelation at higher speed due to system data-rate limits. Notable in the amplitude error images (right of FIG. 3a) is the absence of imaging artefacts such as overshoot, parachuting or ringing. Taken together, these images show good tracking behaviour even at the highest scan rates.

Faster AFM imaging also enables the ability to take a high-resolution overview image and digitally investigate regions at higher magnification. This task presents a challenge to AFM systems because at large scan areas, the surface speed remains high even for low line scan rates. As a demonstration of how the SU-8 cantilevers enable this feature, large areas of a Celgard sample were imaged.

Celgard is a standard sample for assessing the speed performance of AFM imaging due to the challenge of tracking the freely-suspended fibrils in the material. On a standard MultiMode AFM system using large SU-8 cantilevers, we found that we could image Celgard with acceptable quality at line scan rates of 10 Hz, corresponding to a tip velocity of 100 µm/s. At this scan rate, the large silicon cantilever tracked very poorly and was unable to resolve the fibrils at all. On an unmodified commercial high-speed AFM system (FastScan, Bruker Nano Surfaces) we used our small SU-8 cantilevers to scan a 30×30 µm area of Celgard at a line scan rate of 4 Hz at 8192×3200 pixels, corresponding to a surface speed of 261 µm/s (FIG. 3b upper left image).

In comparison, the highest previously reported surface scan speeds we were able to find regarding Celgard using standard small AFM cantilevers was 56 µm/s. The upper right part of FIG. 3b presents a 2.4 µm digital zoom of the overall image corresponding to 656×256 pixels, showing the individual fibrils of the Celgard are still well resolved. The amplitude error and phase images in FIG. 3b show further evidence that the AFM tracks the surface well.

Electronic Readout of AFM Cantilevers

The optical beam detection technique is the most common method to detect the deflection of AFM cantilevers. It is easily implemented and very sensitive, however it requires a number of components, such as lasers, objectives, and photodetectors, which require both space and the ability to align them with the cantilever. Furthermore, optical diffraction sets the minimum width of the cantilever to a practical lower limit of about 2 µm. For these reasons, there has been much interest in the development of cantilevers with integrated deflection sensing elements (so-called self-sensing cantilevers). Cantilevers using resistive or piezoresistive, piezoelectric, thermal and capacitive detection techniques have been developed. Thus far, the performance of the current self-sensing cantilevers still lags behind the optical beam detection performance, and so these cantilevers are generally only used in situations where having optical beam detection is not possible.

SUMMARY

The present invention addresses the inconveniences and problems of the background art and concerns a cantilever or membrane, an Atomic force microscope, molecule detector, biosensor or multi-cantilever array including at least one such cantilever or membrane. The present application also concerns a method for producing an elongated beam of the cantilever or membrane as well as a method for producing a cantilever or membrane.

Other advantageous features can be found in the dependent claims.

BRIEF DESCRIPTION OF THE FIGURES

The above object, features and other advantages of the present invention will be best understood from the following detailed description in conjunction with the accompanying drawings, in which.

DETAILED DESCRIPTION OF THE INVENTION

Figure 1:
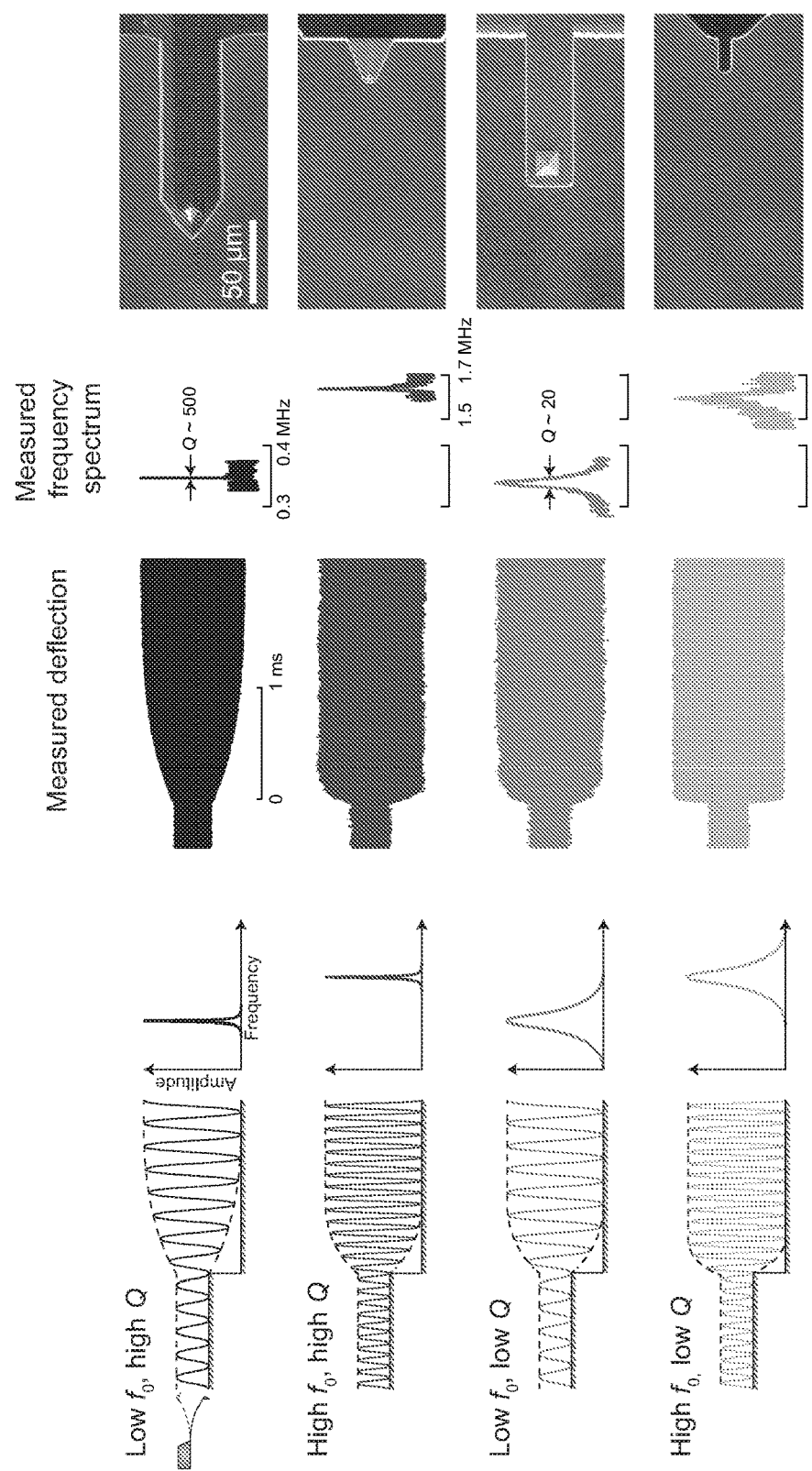
FIG. 1 is a Schematic of the transient response of a cantilever and its relation to the resonance frequency and quality factor, a standard AFM cantilever (top row) has a low resonance frequency and high Q; experimentally, this leads to a long amplitude response time; small cantilevers designed for high-speed imaging have thus far focused on increasing the resonance frequency only (second row), which decreases the response time but requires special instrumentation for use of the cantilevers; alternately, lowering the Q of the cantilever by using a cantilever material with inherent dampening characteristics can yield a similar benefit without the need to reduce the cantilever dimensions (3rd row); a high resonance frequency, low Q cantilever optimized for short response time can be created by reducing the dimensions of the large, low Q cantilever (bottom row)
Figure 2:
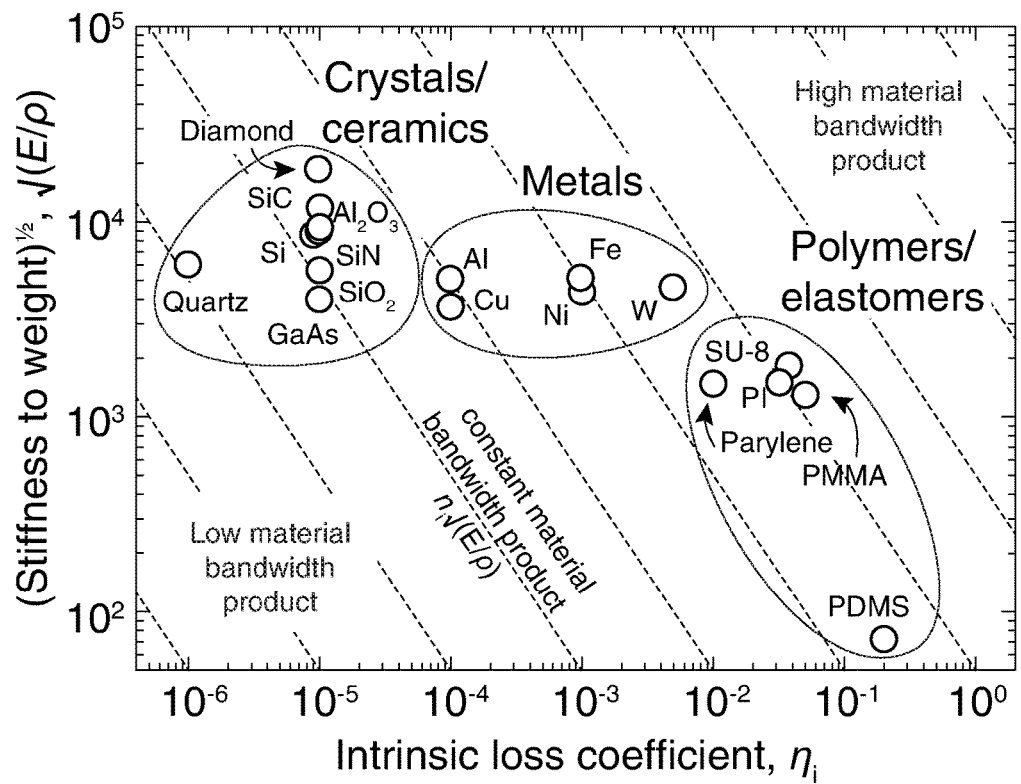
FIG. 2 shows potential cantilever materials, classified according to the square root of the stiffness to weight ratio $\sqrt{(E/\rho)}$ and the intrinsic loss coefficient $\eta_i$.
Figure 3:
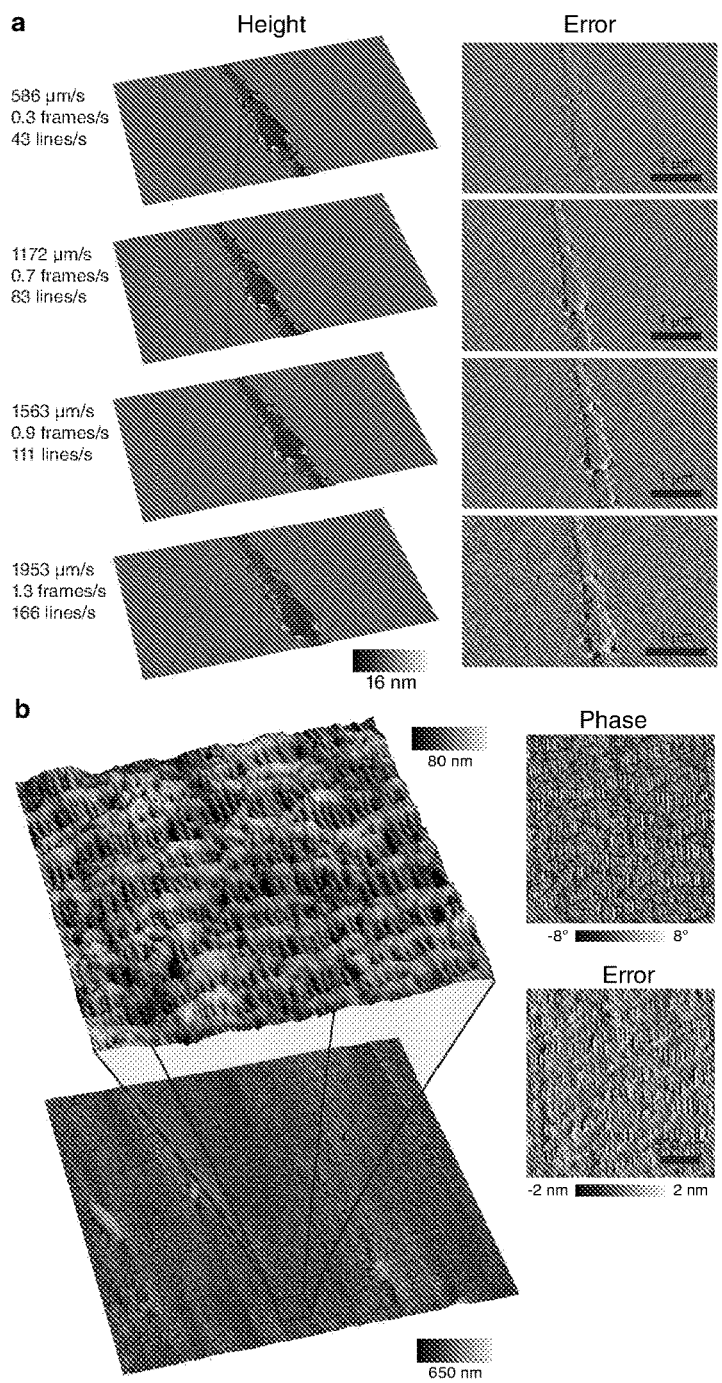
FIG. 3 shows HS-AFM AM-mode imaging in air using small SU-8 cantilevers where a) shows imaging of sharp step edges in sanded mica, the maximum scan rate achieves over 1 frame per second while maintaining good surface tracking; and b) shows a high-resolution overview imaging of a Celgard sample at a tip surface speed of 261 μm/s, 6 times faster than previous reports, the overview image is 8192×3200 pixels and the digital zoom-ins are 656×256 pixels.

The present disclosure may be more readily understood by reference to the following detailed description presented in connection with the accompanying drawing figures, which form a part of this disclosure. It is to be understood that this disclosure is not limited to the specific conditions or parameters described and/or shown herein, and that the terminology used herein is for the purpose of describing particular embodiments by way of example only and is not intended to be limiting of the claimed disclosure.

Motivating Factors

The concept of material damping for high bandwidth AFM probes is demonstrated with a prototype SU-8 cantilevers. This probe architecture, however, has some limitations:

SU-8 and other polymers are poor materials for making sharp and wear-resistant tips. Although reasonably sharp tips can be made via molding, the tips suffer from very high wear rates and blunt quickly. In contrast, according to the present invention, the tip can be made out of much harder materials such as silicon or silicon nitride, two materials that are used commercially to make good quality tips for AFM imaging.

SU-8 and other polymers are poor materials for the chip body (to which the cantilever is fixed). Resonances of the chip structure near or below the cantilever resonance lead to loss of drive efficiency and an unclean drive signal when using a piezo to excite the cantilever. A polymer chip body has resonances at lower frequency than a silicon chip body of the same dimensions. Given the industry has adopted a set of standard chip body dimensions, compensating the poor performance of a polymer chip body by changing the dimensions is not easily achievable.

Furthermore, for self-sensing cantilevers, the limitations of current self-sensing architectures are noted as well as the use of a relatively soft material such as a polymer for a self-sensing cantilever:

The signal of the self-sensing cantilever is directly related to the distance the sensor is located away from the neutral axis of the cantilever. For cantilevers made from hard materials, however, increasing the thickness quickly leads to an unusably stiff cantilever.

A common requirement in self-sensing cantilevers is that the cantilever is able to operate in liquid. In traditional cantilever designs, this often means that a thick protective coating over the strain sensing element is applied, which leads to difficulty with tip integration and negatively impacts the sensitivity through a shift in the neutral axis.

Adding a strain sensor onto a cantilever can perturb the behaviour of the cantilever, which locally can experience a reduction in strain around the sensing element; thus, making a self-sensing cantilever out of a soft material and adding on a stiff strain-sensing element can reduce the expected signal based on the geometry of the designed cantilever.

Major Features and Aspects of the Cantilever Architecture According to the Present Invention In order to both optimize the ratio $f_0/Q$ and to overcome the issues described above, one aspect of the present invention concerns a composite, multilayered cantilever structure that includes layers of high loss coefficient (but low elastic modulus and low density) with layers of high elastic modulus (but high density and low loss coefficient). Here, high loss coefficient refers to values above $10^{-2}$, high elastic modulus refers to values above 10 GPa, and high density refers to values about 1500 kg/m$^3$. Suitable methods for measuring elastic modulus of thin layers include methods such as nanoindentation (see for example reference 26), bulge testing (see for example reference 27), or microbeam deflection (see for example reference 28). Measurement of intrinsic loss coefficient may be performed using dynamic mechanical analysis or nanoindentation (see for example reference 29), or using a reference beam coated with the material of interest, as in ASTM E756 and also applied to microscale systems (see for example reference 30). This architecture of the present invention has a number of benefits to the issues described above, including:

In air and vacuum, the quality factor of the cantilever will be substantially determined by the material properties of the layer(s) with high loss modulus.

The layer(s) of high elastic modulus provide a suitable support for tip and/or strain-sensor integration. In certain cases, these layers could be themselves a multilamellar structure.

In one embodiment of the invention, the cantilever is made up of a three layer structure, with an inner core made up of a layer with high loss modulus sandwiched between two layers of high elastic modulus. This embodiment has a number of advantages compared with cantilevers made of a uniform material:

The structure is overall substantially symmetric, which reduces thermally-induced or residual stress-induced bending of the cantilever. However, if an asymmetry is desirable, the structure may be also made intentionally asymmetric.

Strain-sensing elements can be integrated within the multilayer structure, inherently protected from the outside environment.

The distance of the strain sensor from the neutral axis can be increased relative to a uniform cantilever, without increasing the spring constant of the cantilever.

The cantilever performance metric $f_0^2/k$ may be increased. For equivalent cantilever spring constant, the cantilever can have a higher resonance frequency than a cantilever made out of a uniform material while maintaining the same spring constant. This result is achieved by reducing the mass of the cantilever in the core, where the elastic modulus has less influence on the bending stiffness of the cantilever.

Figure 4A:
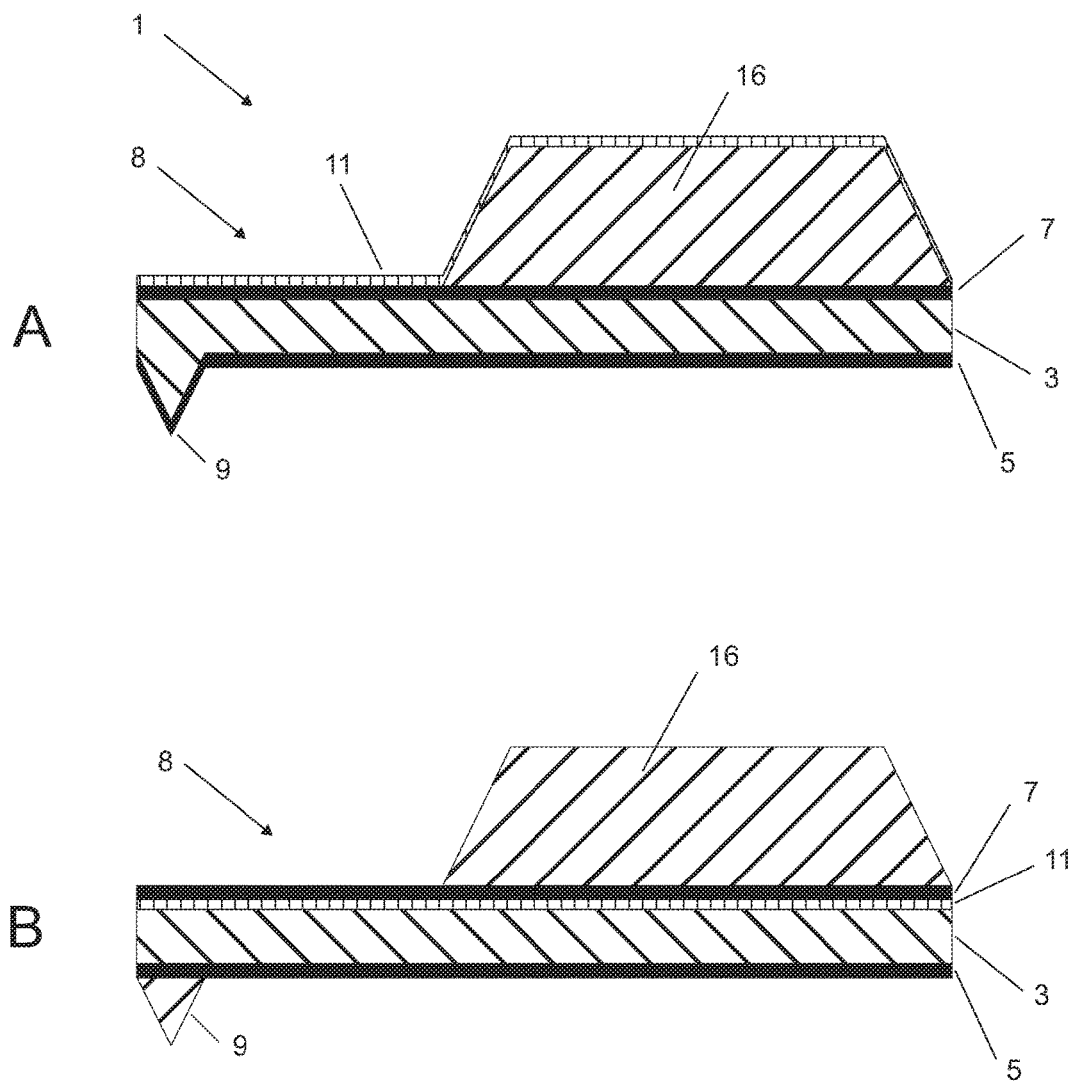
FIGS. 4a and 4b show a cantilever structure according to an aspect of the present invention, where A and B show a schematic of the cantilever architecture for optical deflection readout, the most critical aspect is the multilaminar nature of a thick core separating outer layers with higher elastic modulus, the tip may be integrated in the outer layer or adhered to that layer, an optically-reflective layer may be included on an outer or inner layer (or multiple layers); where C to E show three possible architectures of the cantilever for self-sensing deflection detection; the strain sensing element is integrated onto an outer layer, the strain sensor can either be a strain-sensing material deposited over a portion of the cantilever (C) or a full layer of a strain-sensing material (D); the strain-sensing element is preferably located as far as possible from the neutral axis, and can either be shielded from the outer surface of the cantilever such that it is inherently protected from the outside environment (C) or exposed to the environment when shielding is unnecessary (E)

Part A of FIG. 4a shows a schematic of an exemplary multilayer cantilever design intended for optical deflection readout and the major features of this design. The cantilever 1 maintains a core 3 substantially made up of a material with high loss coefficient, sandwiched between two layers 5, 7 of high elastic modulus. The core 3 and the two outer layers 5, 7 form a beam 8 of the cantilever. A tip 9 is integrated into the lower layer 5 (in this depicted embodiment, the tip is made via moulding the hard material in a pit with a sharp point).

A thin metal layer 11 can be deposited on the outside of the upper cantilever surface 15 to provide an optically reflective surface.

The cantilever further includes body 16 for supporting the beam 8.

An alternative embodiment, shown in part B of FIG. 4a, comprises the trilayer structure with the optically-reflective coating on the interior surface 17 of the upper layer 11, and a sharp tip 19 made of a different hard material (such as silicon) to that of layers 5, 7 and that is attached to the outer surface of the lower layer 5. A second metal coating can be applied to the top or bottom side of layer 5. Any such combination can be performed with either a moulded tip or an attached tip.

Figure 4B:
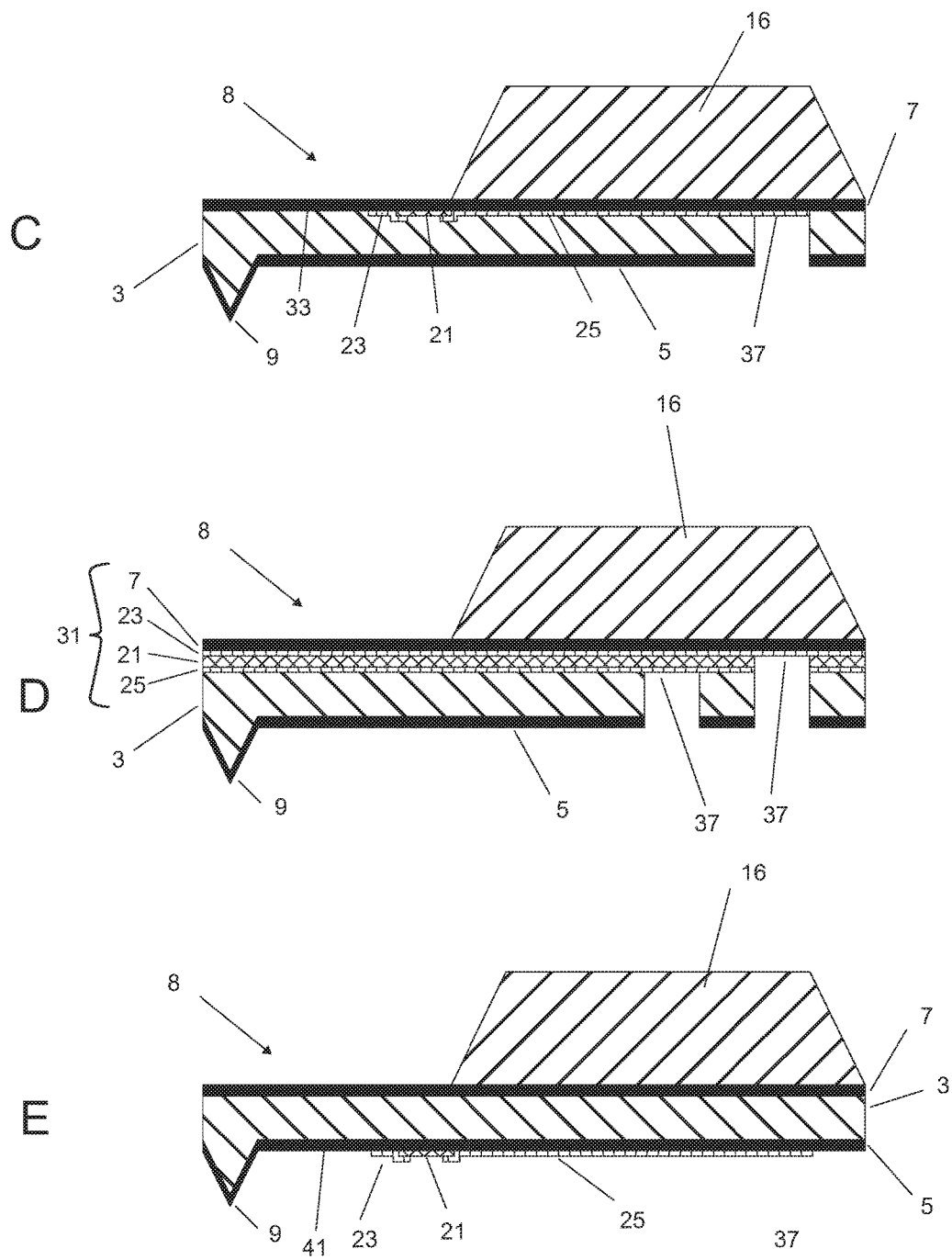

FIG. 4b shows three different embodiments for integrating self-sensing elements into the trilayer cantilever. A self-sensing cantilever needs to maximize the strain at the base of the cantilever, without making the cantilever undesirably stiff.

Part C of FIG. 4b shows a self-sensing cantilever where the strain sensor 21 is deposited over only a small portion of the cantilever. This strain sensor 21 could be metal traces, a piezoresistive material like doped crystalline silicon or polysilicon or a nanogranular metal or a 2D material like graphene or molybdenum disulfide, and could be deposited as a full or partial layer and subsequently patterned via lithography, or deposited via a direct-write technique like electron beam-induced deposition. This sensor 21 can be deposited onto an inner surface 33 of the upper layer 7 such that it is located within the multilayer structure and hence inherently protected from the outside environment.

Part D of FIG. 4b shows a full-layer strain sensor, as would be implemented for piezoelectric materials like for example aluminum nitride or lead zirconate titanate (PZT). In this implementation, the strain sensor layer 21 is itself sandwiched between two electrically conducting contact layers 23, 25, and an upper layer 7 that provides a substrate on which the layer 7 attaches to a chip body 16 and also shields the upper metal contact layer 23 from the outside environment. This multi-layer structure comprising or consisting of layers 23 and 7 forms the upper layer with high elastic modulus 31 of the trilayer structure. The lower layer of high elastic modulus 5 may be a simple single layer of silicon nitride or other material, in which a tip 9 is integrated or attached to. Access to bonding pads 37 could be made by etching at appropriate points through the multilayer structure, stopping on the conducting layers.

Part E of FIG. 4b shows a self-sensing cantilever similar to that of parts C or D of FIG. 4b, except the strain sensor is located on the outer surface 41 of the multilayer structure. For use in environments where the strain sensor and contact traces do not need to be shielded, this can provide an additional route to fabrication and the benefit that the strain sensor 21 is located further from the neutral axis of the cantilever. The strain sensor 21 in this implementation could be made of the same material as described above in part C of FIG. 4b or with a piezoelectric layer as shown in part D of FIG. 4b.

The present invention thus relates to a cantilever comprising the body 16 and the elongated beam 8 attached to the body 16. The elongated beam 8 includes a first layer 3 comprising a first material, a second layer 5 comprising a second material having an elastic modulus different to that of the first material, and a third layer 7 comprising a third material having an elastic modulus different to that of the first material. The first layer 3 is sandwiched between the second layer 5 and the third layer 7.

The first material can have an elastic modulus inferior to that of the second and third material; and/or the first material can have a loss coefficient superior to that of the second and third material; and/or the first material can have a density inferior to that of the second and third material.

The first material may have an elastic modulus superior to that of the second and third material; and/or the first material may have a loss coefficient inferior to that of the second and third material.

The first material can be a viscoelastic material.

The second layer 5 and the third layer 7 may have a smaller layer thickness that that of the first layer 3.

The cantilever may include the optically reflective layer 11 for determining movement of the cantilever and the optically reflective layer 11 can be deposited on the first layer or is sandwiched between the first layer 3 and the second layer 7. The optically reflective layer 11 can be deposited on an inner or outer surface of the first or second layer.

The beam 8 can include the sensing tip 9, 19 formed by the second layer 5, or formed of a material different to that of the second 5 and third 7 layers. The beam 8 can also include the sensing element 21 to detect the deflection of the beam 8. The sensing tip can be integrated into or be integral with the second layer 5.

The sensing element 21 can extends substantially along a full length of the beam 8. The sensing element 21 may alternatively extends partially along a length of the beam 8.

The cantilever can include a first 23 and a second 25 metal layer sandwiching the sensing element 21 to measure a deflection of the beam 8.

The first metal layer 23 can be located between the sensing element 21 and the third layer 7, and the second metal layer 25 can be located between the sensing element 21 and the first layer 3.

The cantilever can further include a first metal layer 23 contacting a first portion of the sensing element 21 and a second metal layer 25 contacting a second portion of the sensing element 21 to measure a deflection of the beam 8.

The sensing element 21 and the first 23 and second 25 metal layers can be attached to the third layer 7.

The sensing element 21 and the first 23 and second 25 metal layers may be attached to an inner surface 33 of the third layer 7.

The sensing element 21 and the first 23 and second 25 metal layers may alternatively be attached to the second layer 5. The sensing element 21 and the first 23) and second 25 metal layers are attached to an outer surface 41 of the second layer 5.

According to another aspect of the present invention, a method for producing the elongated beam 8 of the cantilever comprises the steps of providing the first layer 3 comprising a first material, providing the second layer 5 comprising a second material having an elastic modulus different to that of the first material, providing a third layer 7 comprising the third material having an elastic modulus different to that of the first material, and enclosing the first layer 3 between the second layer 5 and the third layer 7.

Targeted Application of the Invention and Extension to Other Domains

Atomic force microscopy is one exemplary targeted application area of this cantilever structure according to the present invention, specifically imaging using dynamic modes (such as tapping mode or peak force tapping), however the architecture may find wide use in other application areas. For example, in cantilever-based or membrane-based detection of small molecules. Using the self-sensing architecture, one can create a multi-cantilever array structure or membrane structure, such as those used in biosensing applications (see for example reference 31), without the need for a cumbersome multi-cantilever optical readout system. Another technological extension is to introduce microfluidic channels within the polymer layer 3. This can, for example, enable cantilever-based liquid or cell dispensing, biomolecule detection or other types of applications.

The first layer 3 may thus include a microfluidic channel.

According to another aspect, the present invention relates to an atomic force microscope, a molecule detector, a biosensor, or multi-cantilever array including at least one such cantilever.

Influence of Core Layer Mechanical Properties

Materials suitable for use as the core layer in the exemplary cantilevers described above may span a wide range of elastic modulus. For example, Polydimethylsiloxane PDMS has a lower elastic modulus of order $10^6$ Pa, and SU-8 can have an elastic modulus of nearly $10^{10}$ Pa. Incorporating these different polymers into the central layer 3 of the cantilever can have significant influence on the overall mechanical properties of the cantilever.

Figure 5:
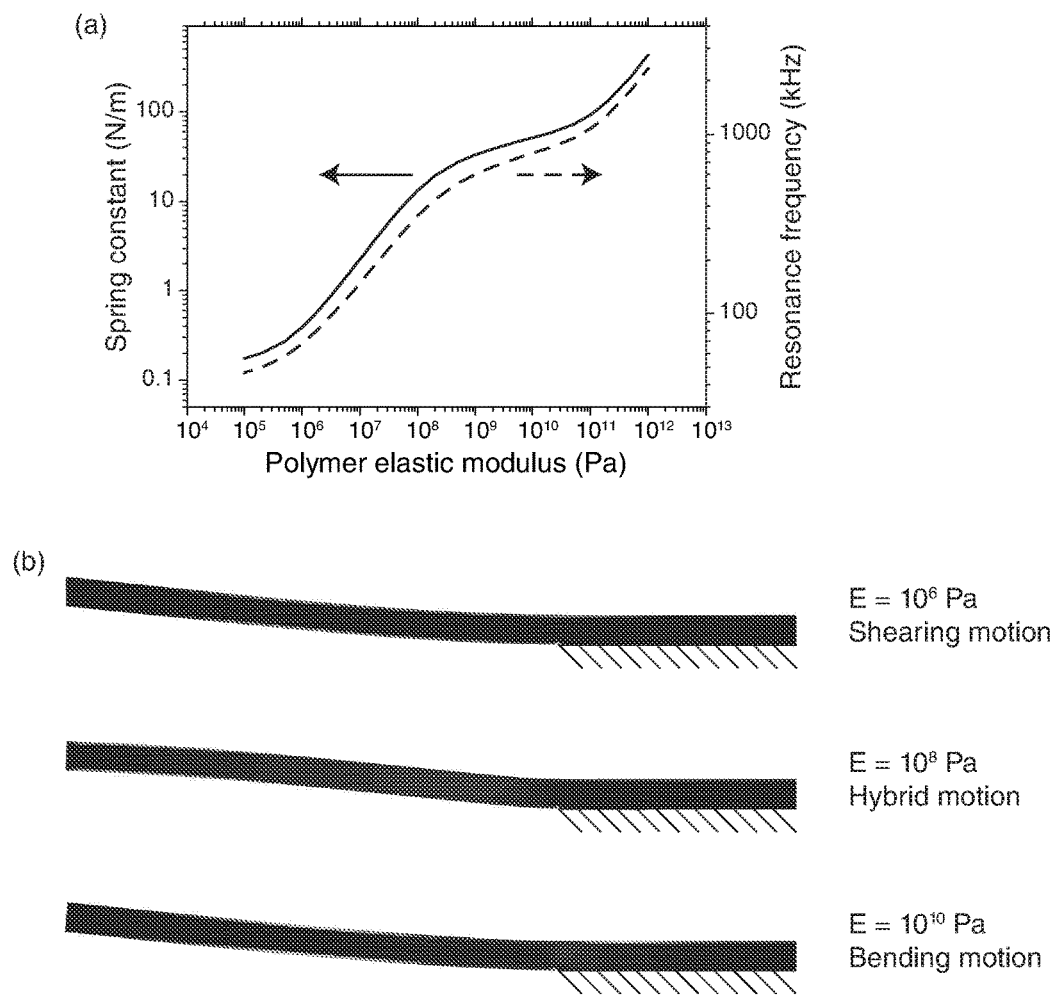
FIG. 5 presents the influence of the elastic modulus of the core layer on the mechanical properties and resonance behaviour of the cantilever.

FIG. 5 shows the variation in expected spring constant and resonance frequency for a 100 μm long cantilever with 500 nm silicon nitride outer layers and a 5 μm thickness polymer layer with a varying elastic modulus, based on a 2D FEM simulation (Comsol). As the elastic modulus is varied over 8 orders of magnitude, the spring constant varies by 4 orders of magnitude and the resonance frequency by 2 orders of magnitude (FIG. 5(a)). In addition, the resonance mode shape changes from a shearing motion at low elastic modulus, to a complex hybrid motion at a mid-range elastic modulus to a bending motion similar to a uniform beam at high elastic modulus.

This variation lends a large capacity for tuning cantilever mechanical properties to achieve a desired behaviour. In particular, a low elastic modulus polymer would be suitable for softer, optically-detected cantilevers (the stress on the outer layers remains low in the shearing mode). A higher elastic modulus would be desirable for a self-sensing cantilever or a stiffer, optically-detected cantilever.

Cantilever Fabrication and Performance Evaluation

Figure 6A:
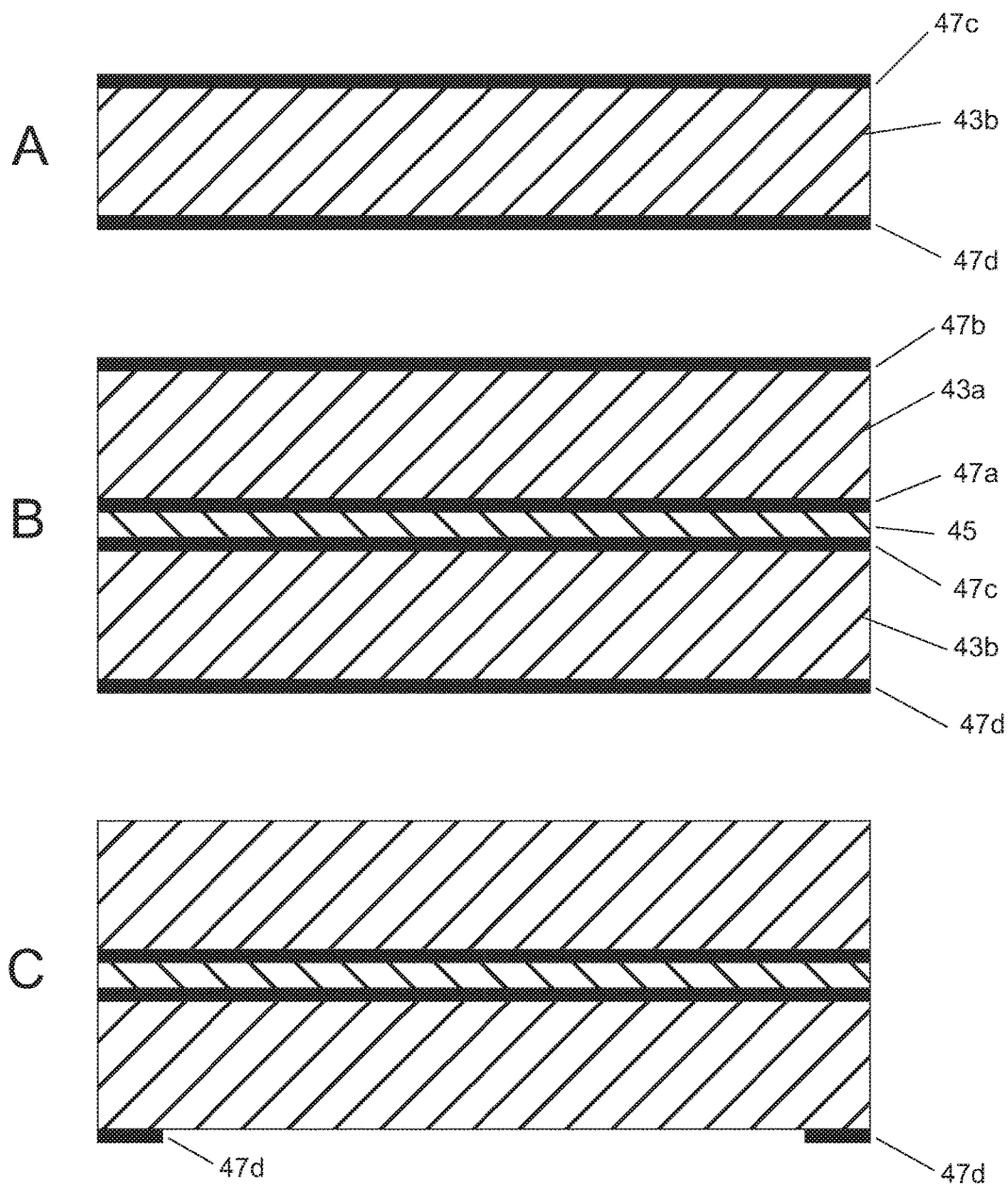
FIGS. 6a and 6b: illustrate, according to another aspect of the invention, a basic process flow for fabrication of the cantilever with core separating outer layers with higher elastic modulus.
Figure 6B:
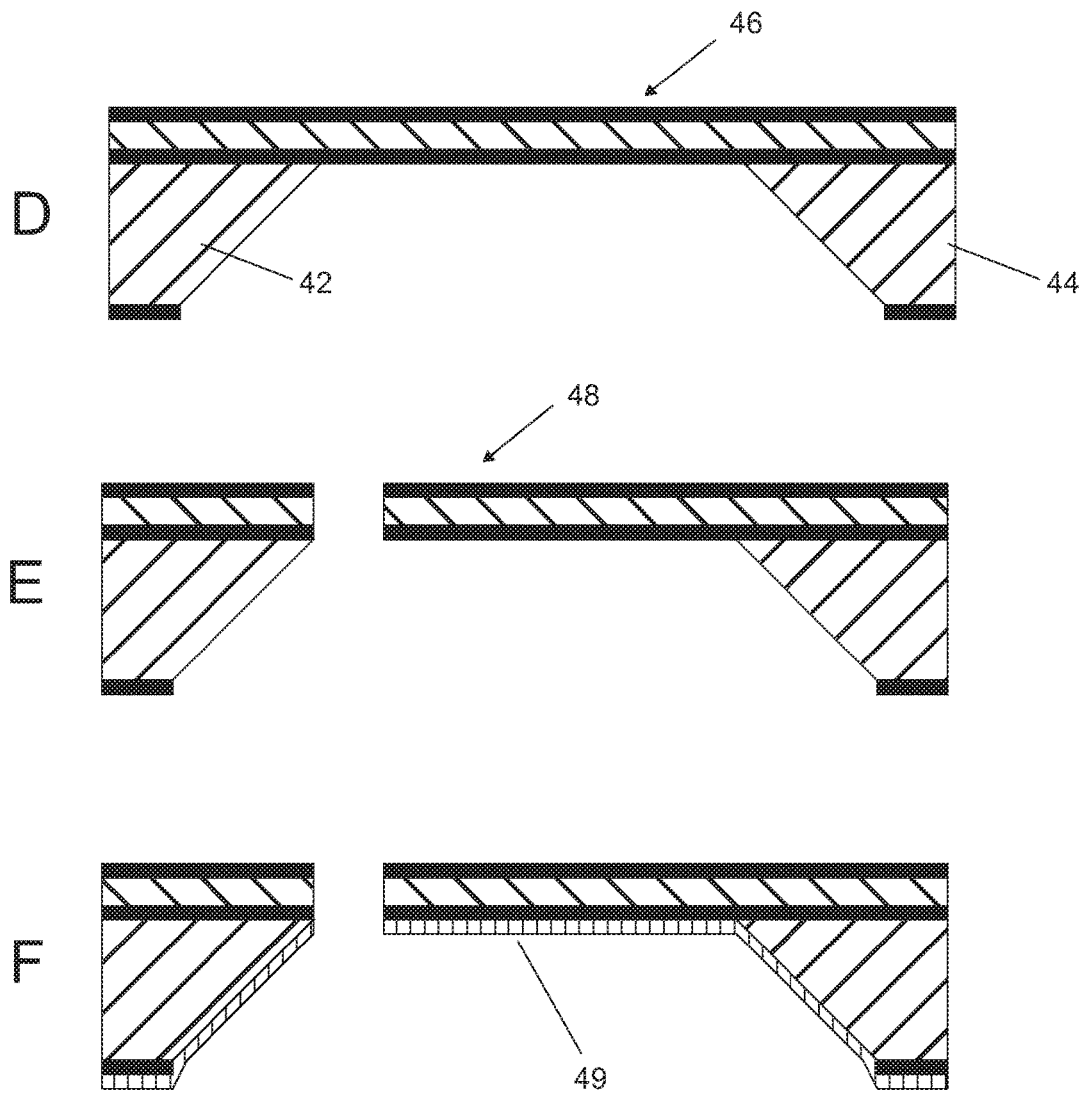

The outline of a process flow that has been successfully implemented according to another aspect of the present invention is shown in FIGS. 6a and 6b. This process is only one approach towards achieving the desired end structure. This process is designed for cantilevers to be used with optical deflection detection, hence there is no integration of a strain sensing element into the structure.

It is noted that one novel aspect of this process flow is the use of two separate wafers that are bonded together using the polymer layer. Other processes have used two wafers along with wafer bonding (including polymer wafer bonding) in the fabrication process, however one important difference with the process of the present invention is that elements of both wafers form an integral component of the cantilever. In this manner, the structure of the hard outer layers, including processing of the tip structure and processing of the strain-sensing element, in the case of a self-sensing cantilever, could proceed independently on standard wafers before being combined into a multilayer sandwich structure.

As shown in FIGS. 6a and 6b, in step A, layers 47c and 47d are grown or deposited or doped on the top and bottom surface of a silicon wafers 43b. The same step is performed on second similar wafer. Preferred materials for layers 47c and 47d are silicon dioxide or silicon nitride; other options could be doped silicon, polysilicon, gallium nitride, silicon carbide, tungsten carbide, titanium dioxide, a metal like tungsten, etc. The range of thickness for these layers could be from 10 nm up to about 2 μm. The range of elastic modulus of this layer could be from 10 GPa up to 600 GPa. Suitable deposition processes include CVD, MBE, sputtering, thermal oxidation, ALD, etc. The current process uses low-stress silicon nitride with thickness of 100 nm, deposited by LPCVD. The elastic modulus of this material is approximately 250 GPa.

In step B, by way of layer 45, bond together wafers 43a and 43b. The thickness of layer 45 ranges from about 100 nm up to 20 μm. Layer 45 is ideally a polymer with elastic modulus in the range from about 0.5 MPa up to about 10 GPa, and intrinsic loss coefficient greater than $10^{-2}$. Layer 45 could be deposited using processes like CVD, spin-coating, spray coating, screen printing, or transfer printing, etc. The deposition could be onto layer 47a, layer 47c, or partially on layer 47a and partially on layer 47b. Suitable polymers include parylene, polyimide, PDMS, SU-8, BCB, polyurethane, and many others. The current process uses parylene-C deposited by CVD with 2 μm thickness deposited onto both layers 47a and 47c. The elastic modulus of parylene-C is about 2.8 GPa and density about 1289 kg/m³. An adhesion promoter may be necessary to enhance adhesion of the polymer layer. The current process uses parylene adhesion promoter A-174. The bonding is performed by bringing wafers 43a and 43b together under a combination of applied pressure and temperature, along with possible surface pre-treatments, dependent upon the particular polymer used. The current process uses a 20 second pre-treatment of 200 W oxygen plasma, followed by bonding under vacuum environment, with a tool pressure of 100 kPa at a temperature of 280° C for 30 minutes.

In step C, layers 47b and 47d are removed or partially removed through lithography and etching. The etch could be a dry or wet etch depending on the composition of the layers. The current process uses a dry etch and photolithography.

In step D, silicon wafers 43a and 43b are etched using KOH or similar anisotropic wet etchant like TMAH in order to release a multilayered membrane 48. The lower wafer 43b is etched such that part of the wafer forms a remaining support structure 42 and part of the wafer forms the chip body 44. An important aspect of this etch is that the chip body forms an inclined surface to provide access for optical deflection detection onto the cantielver. The current process uses KOH, which forms an inclined surface at 54.7°. Alternatively, the wafers 43a and 43b could be etched using a dry etch process like DRIE, which could be tuned to achieve an inclined surface or through a technique like greyscale lithography.

In step E the shape of the cantilever 8 is defined from the membrane formed in the previous step via lithography and etching through layers 47a, 45 and 47c. This etch could be a wet etch or dry etch and may need an additional hard mask, and/or a mechanical support layer or etch stop layer. In the current process, a 2 μm thick aluminum mechanical support and etch stop layer is evaporated onto the bottom side of the membrane. The current process uses either a photoresist mask, or a photoresist mask in combination with a 300 nm evaporated aluminum hard mask. The layers are etched in a sequential dry etch process, first etching the hard mask, using a photoresist mask, and subsequently layers 47a, 45 and 47c.

In step F, a reflective coating layer 49 is deposited onto the cantilever. This layer could be either evaporated or sputtered, and be composed of any number of reflective materials, ideally being either aluminum or chrome/gold or titanium/gold. In the current process, 5 nm of Cr and 50 nm of Au are evaporated onto the cantilever.

According to another aspect, the present invention thus relates to a method for producing a cantilever comprising the steps of:

providing a first wafer 43a including a first layer 47a deposited on a first external surface of the wafer and a second layer 47b deposited on a second external surface of the wafer, providing a second wafer 43b including a first layer 47c deposited on a first external surface of the wafer and a second layer 47d deposited on a second external surface of the wafer, forming a first structure by depositing a third layer 45 comprising a material having an elastic modulus inferior to that of the first 47a and second layer 47b on the first layer 47a of the first wafer 43a, forming a second structure by depositing a third layer 45 comprising a material having an elastic modulus inferior to that of the first 47c and second layer 47d on the first layer 47c of the second wafer 43b, wafer bonding the first and second structures together by combining the third layer 45 of the first structure with the third layer 45 of the second structure, partially removing the exposed second layer 47b on a first external surface of the bonded structure to expose the first wafer material 43a and create a first etch mask window, and partially removing the exposed second layer 47d on a second external surface of the bonded structure to expose the second wafer material 43b and create a second etch mask window, etching the exposed first wafer material 43a and the exposed second wafer material 43b to remove part of the first and second wafer material and expose a beam 48 including the combined third layers 45 sandwiched between the first layers 47a, 47c, depositing an etch stop and support layer on the second wafer material 43b and the first layer 47c of the second wafer 43b, etching through the beam 48 to divide the bean 48 in two parts, and removing the etch stop and support layer.

A reflective coating may be deposited on the second wafer material 43b and the first layer 47c of the second wafer 43b.

The step of providing a second wafer 43b including a first layer 47c deposited on a first external surface of the wafer and a second layer 47*d* deposited on a second external surface of the wafer further includes a step of depositing a metal layer 51 to measure cantilever deflection on the first layer 47*c* to partially cover the first layer 47*c*, and a step of depositing a metal bonding pad 53 on the metal layer 51 to partially cover the metal layer 51, wherein the third layer 45 comprising a viscoelastic material is deposited on the first layer 47*c*, the metal bonding pad 53 and the metal layer 51.

The first layer 47*a* and the third layer (45) of the beam (48) can be etched to expose the metal bonding pad 53.

During the step of wafer bonding, the third layer 45 flows to adapt to the extra topography presented by the metal bonding pad 53 and the metal layer 51.

Figure 7:
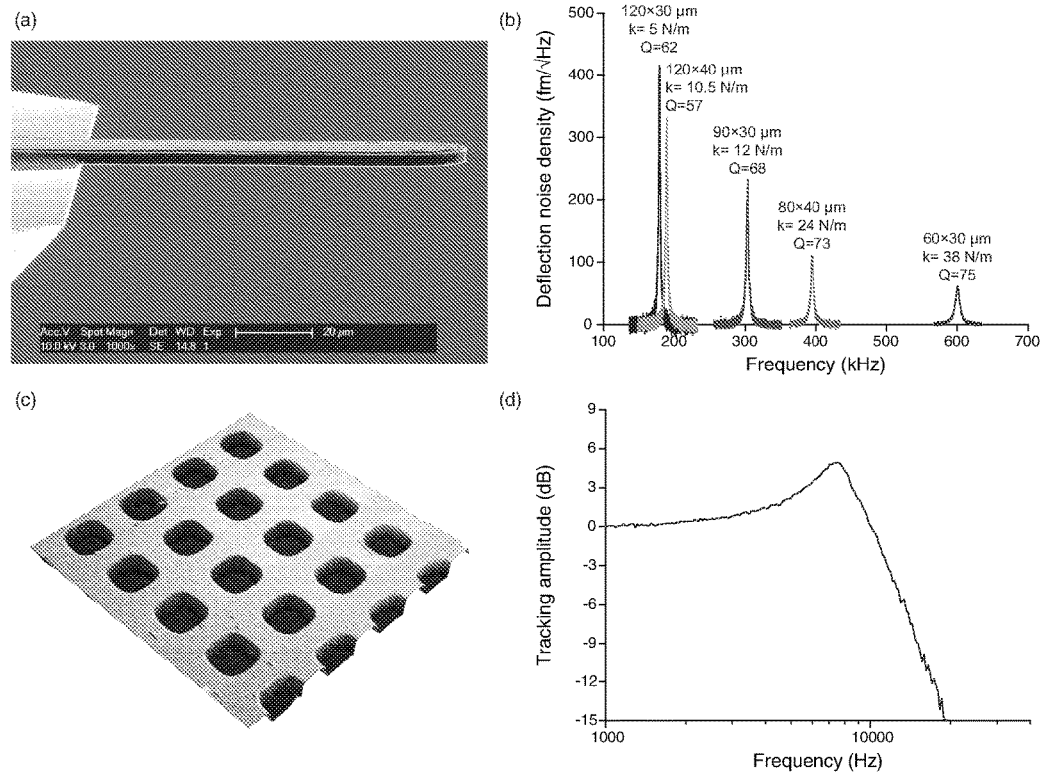
FIG. 7a is an Image of a fabricated cantilever.
FIG. 7b presents a Frequency spectrum of several fabricated cantilevers, where the upper numbers refer to the nominal planar dimensions of the cantilever.
FIG. 7c is an image of a 1×1 μm, 200 nm depth calibration grating taken with a fabricated cantilever.
FIG. 7d presents a measurement of the tapping-mode imaging bandwidth for a cantilever with $f_0$=392 kHz, k=24 N/m and Q=73, the bandwidth defined at the −3 dB point corresponds to 11 kHz.

Using the above process flow, several trilayer MEMS cantilevers have been fabricated and tested. FIG. 7(*a*) shows a SEM image of one cantilever. These cantilevers have 100 nm silicon nitride layers 47, and a 4 μm parylene layer 45, made of two, 2 μm parylene layers 45 bonded together. Of note, the cantilever shows no residual stress bending. Two-layer nitride-parylene cantilevers were also fabricated, which showed substantial residual stress bending.

FIG. 7(*b*) shows measurement of the power spectrum of the thermal deflections for several trilayer cantilevers. This measurement characterises the principle mechanical properties of the cantilever, namely the resonance frequency, spring constant and quality factor. Two features are evident based on this measurement: first, the Q factors are significantly lower than standard AFM cantilevers, and vary little across a wide range of spring constants and resonance frequencies, suggesting that the viscoelastic properties of the cantilever are indeed dominant. Second, the resonance frequency of the cantilever with spring constant 38 N/m is 600 kHz, which is double the resonance frequency of order 300 kHz one would expect for a silicon cantilever with spring constant around 40 N/m (e.g. Bruker model MPP-1123-10).

FIG. 7(*c*) shows an AFM image of a calibration grating taken with a trilayer cantilever, using an unmodified commercial Bruker MultiMode VIII AFM system. FIG. 7(*d*) shows the tapping mode imaging bandwidth of a cantilever with f0=394 kHz, k=24 N/m and Q=73. The imaging bandwidth, defined as the −3 dB frequency of the tracking amplitude, corresponds to 11 kHz. In comparison, a silicon cantilever with f0≈300 kHz has a bandwidth of order 1 kHz.

Tip Integration

Integrating a sharp tip onto the end of the cantilever may be accomplished in a number of different ways. For cantilevers without a batch-fabricated sharp tip, such as those presented above, a tip may be grown (e.g. via electron beam-induced deposition) or glued onto the cantilever.

A more desirable solution is to integrate a tip in the batch-fabrication process. The simplest process for accomplishing this tip integration is to mould a tip in one of the hard layers; this process is an industry standard for creating silicon nitride tips. An overview of the process is shown below in FIGS. 8*a* and 8*b*. A detailed process run card is given later herein in Appendix A.

Figure 8A:
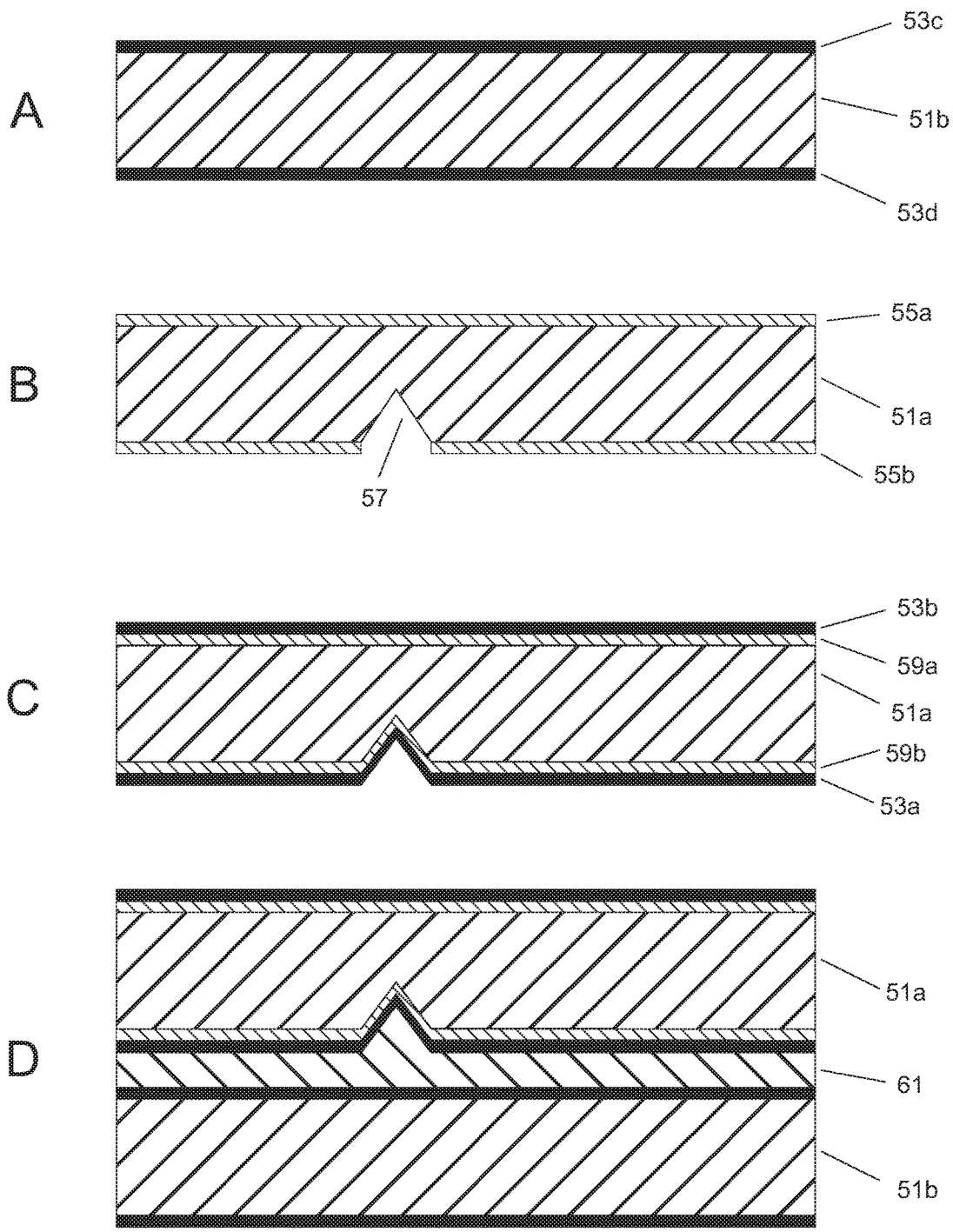
FIGS. 8a and 8b present an overview of a cantilever fabrication process incorporating a batch-fabricated silicon nitride sharp tip according to another aspect of the present invention.
Figure 8B:
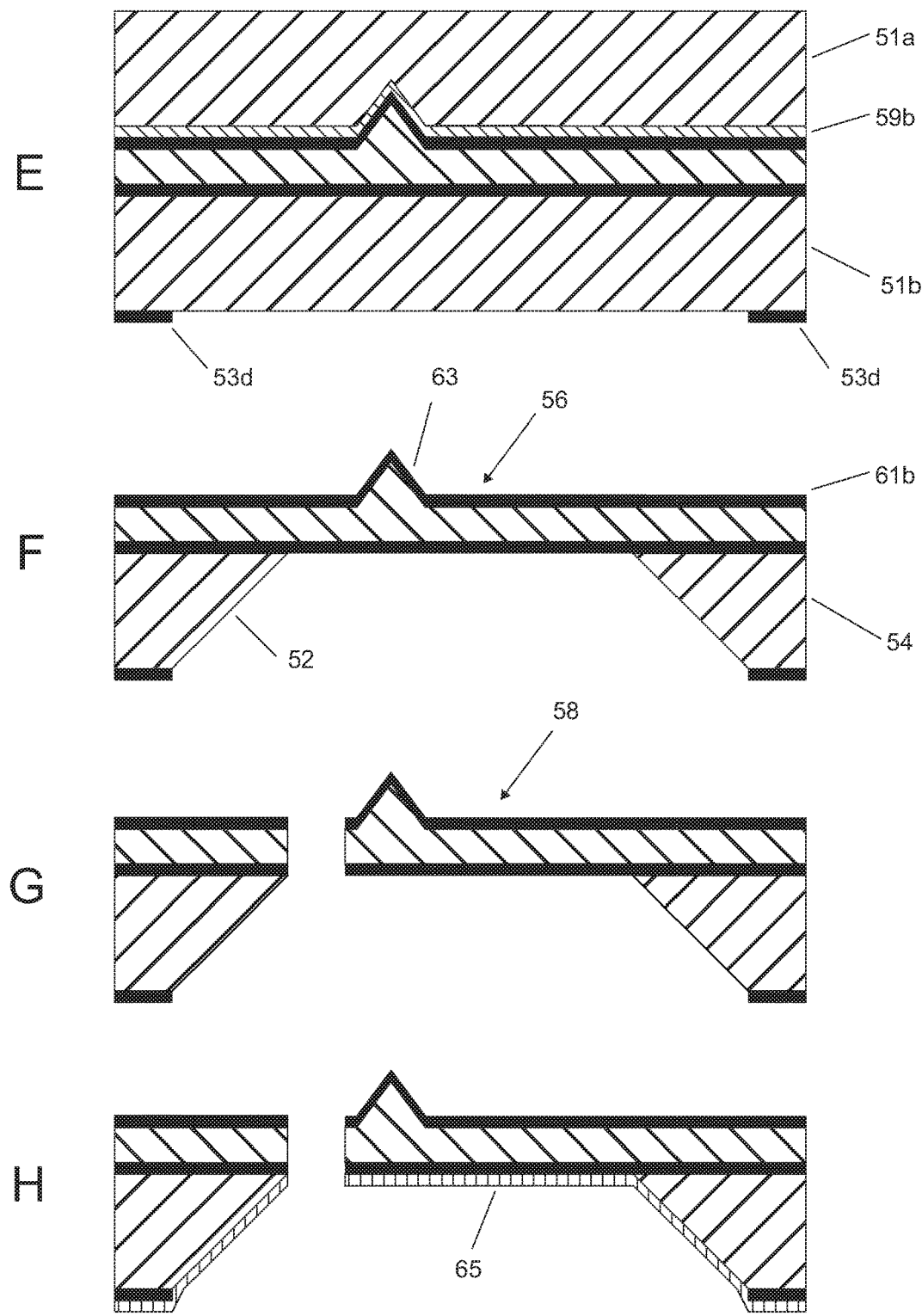

Step A in FIG. 8*a* is performed for layers 53*c* and 53*d* on wafer 51*b* as is described in step A from FIG. 6*a*.

For FIG. 8 step B, on silicon wafer 51*a*, etch mask layers 55*a* and 55*b* are grown or deposited on the top and bottom surface of the wafer. The current process uses 500 nm of thermally grown silicon dioxide. Layer 55*b* is partially removed using lithography and etching. The current process uses photolithography and dry etching. Wafer 51*a*, masked by layers 55*a* and 55*b*, is then etched in order to create a tip-like indentation 57. The current process uses KOH as an anisotropic etchant to form a pyramidal structure where the resulting planes of the silicon surface in the indentation are <111> planes.

As one alternative, the tip-like indent could be etched using an isotropic wet or dry etch to form a hemispherical-like indentation.

In FIG. 8 step C, layers 55*a* and 55*b* are removed (using a dry or wet etch, for example, using BOE as in the current process). Optionally, thermally grow oxide layer 59*a* and 59*b*, which serves to reduce the radius of the bottom of the indent 59. In the current process, layers 59*a* and 59*b* are grown using steam at 950° C. Layers 53*a* and 53*b* are then added, ideally using the same material and processes as for wafer 51*b* from step A.

In FIG. 8 step D, layer 61 is used to bond together wafers 51*a* and 51*b* as described in step B of FIG. 6.

In FIG. 8 step E, layers 53*b*, 53*d* and 59*a* are removed or partially removed through lithography and etching. The etch could be a dry or wet etch depending on the composition of the layers. The current process uses a dry etch and photolithography.

FIG. 8 step F is performed according to the description of step D of FIG. 6. Layer 59*b* must be removed, as part of the wet etch process, or through an additional wet or dry etch step.

FIG. 8 step G is performed according to the description of step E of FIG. 6.

FIG. 8 step H is performed according to the description of step F of FIG. 6.

Self-Sensing Integration

As discussed earlier, three advantages of this architecture for self-sensing integration are that the processing of the tip and self-sensing elements may be performed on separate wafers, that the self-sensing elements may be inherently insulated from the exterior environment, and that the thickness of the cantilever is larger than that of a standard silicon or silicon nitride cantilever for similar spring constant, thus increasing the strain at the sensor (for cantilevers that behave in a bending motion as shown in FIG. 5).

Figure 9A:
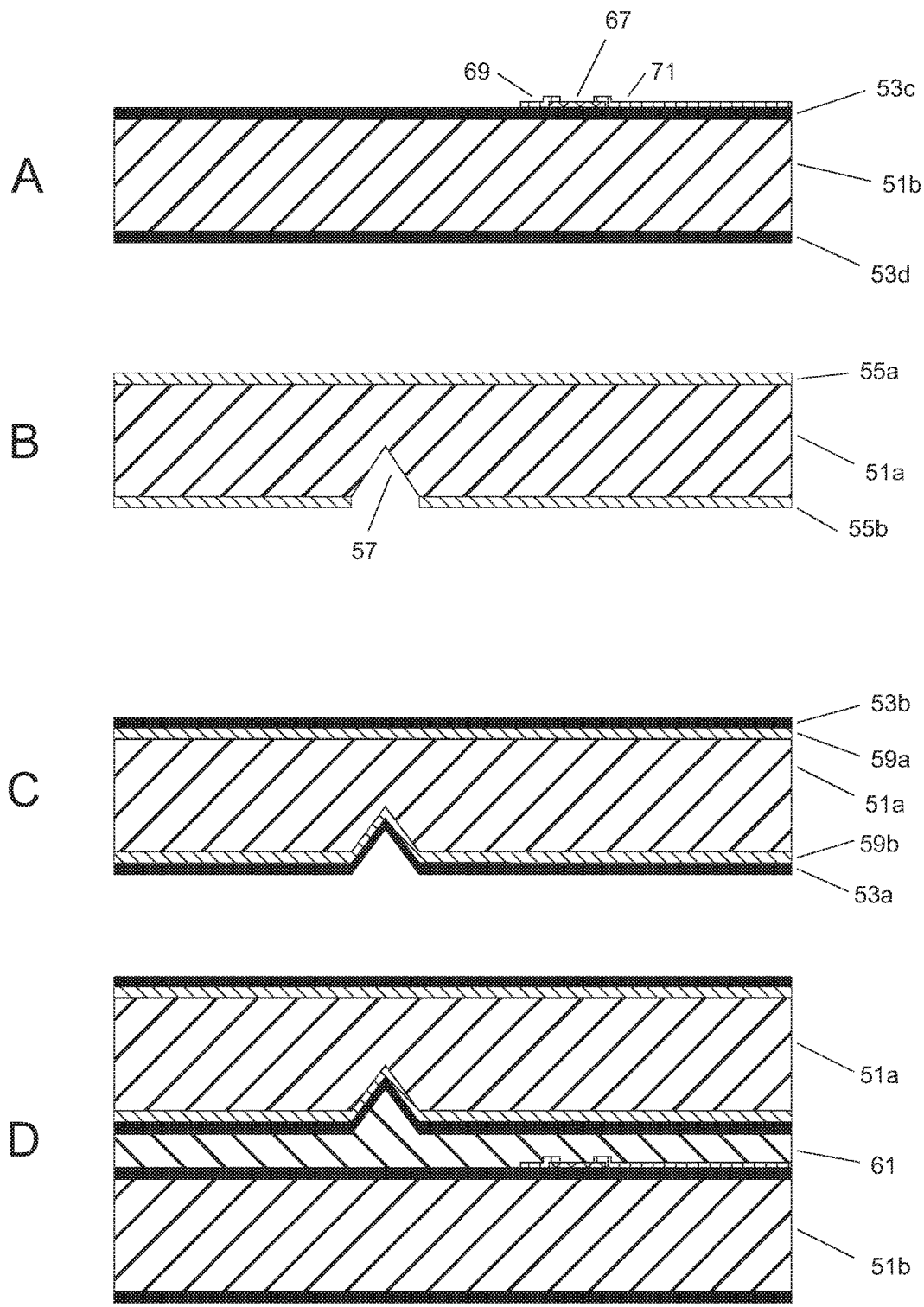
FIGS. 9a and 9b shows an approach towards integration of self-sensing elements into the cantilever fabrication process according to yet another aspect of the present invention.
Figure 9B:
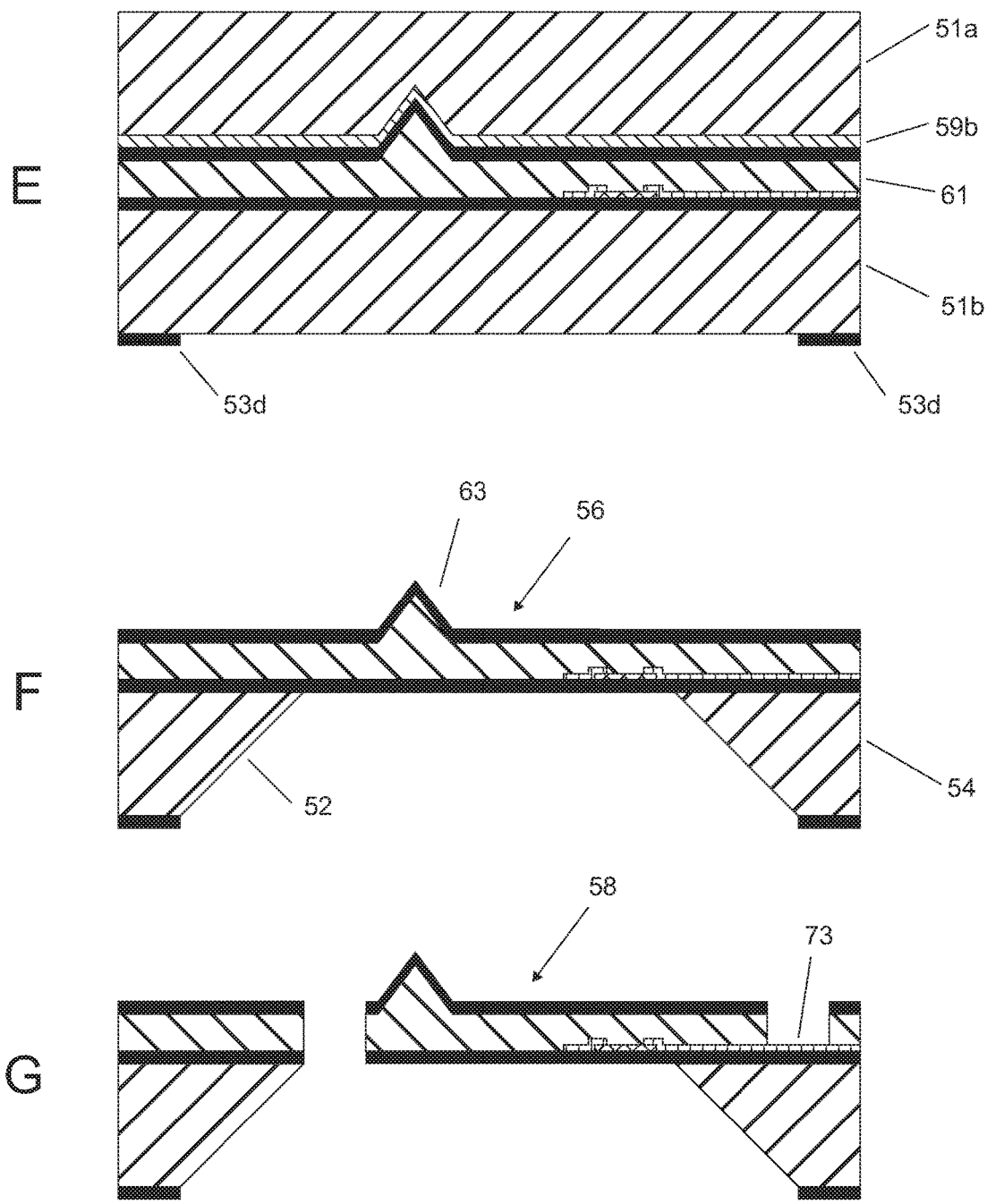

A basic process overview towards integrating thin metal self-sensing elements is shown in FIGS. 9*a* and 9*b*. It adopts the basic process flow shown in FIG. 8.

In FIG. 9*a* step A, layers 53*c* and 53*d* are grown or deposited or doped on wafer 51*b* as is described in step A of FIG. 6. Subsequently, strain sensor element 67 and electrical connections 69 and 71 are deposited (or deposited and patterned). Only one set of sensor element and electrical connections is shown, but actual devices may include a plurality of sensors and connections, in locations both on the cantilever and off of the cantilever. In the current process, the sensor element is made from evaporated Cr/Au with thickness 5/50 nm and the electrical connections are made from evaporated Cr/Au with thickness 20/200 nm. Other potential sensor elements include any kind of piezoresistive material, for example doped crystalline silicon or polysilicon, granular metals or 2D materials.

FIG. 9 steps B-F follow the description given for steps B-F of FIG. 8.

FIG. 9*b* step G follows the description given for step G of FIG. 8, with the addition of etching openings 73 in order to make electrical connection between the electrical connections 67 and 71, and further instrumentation off of the cantilever chip. These openings would be etched either during the same step as the cantilever release as described in FIG. 6 step F (if the electrical contact layer acts as a suitable etch stop for the etch process), or with a similar etch only in the opening region before the cantilever release step.

Figure 10A:
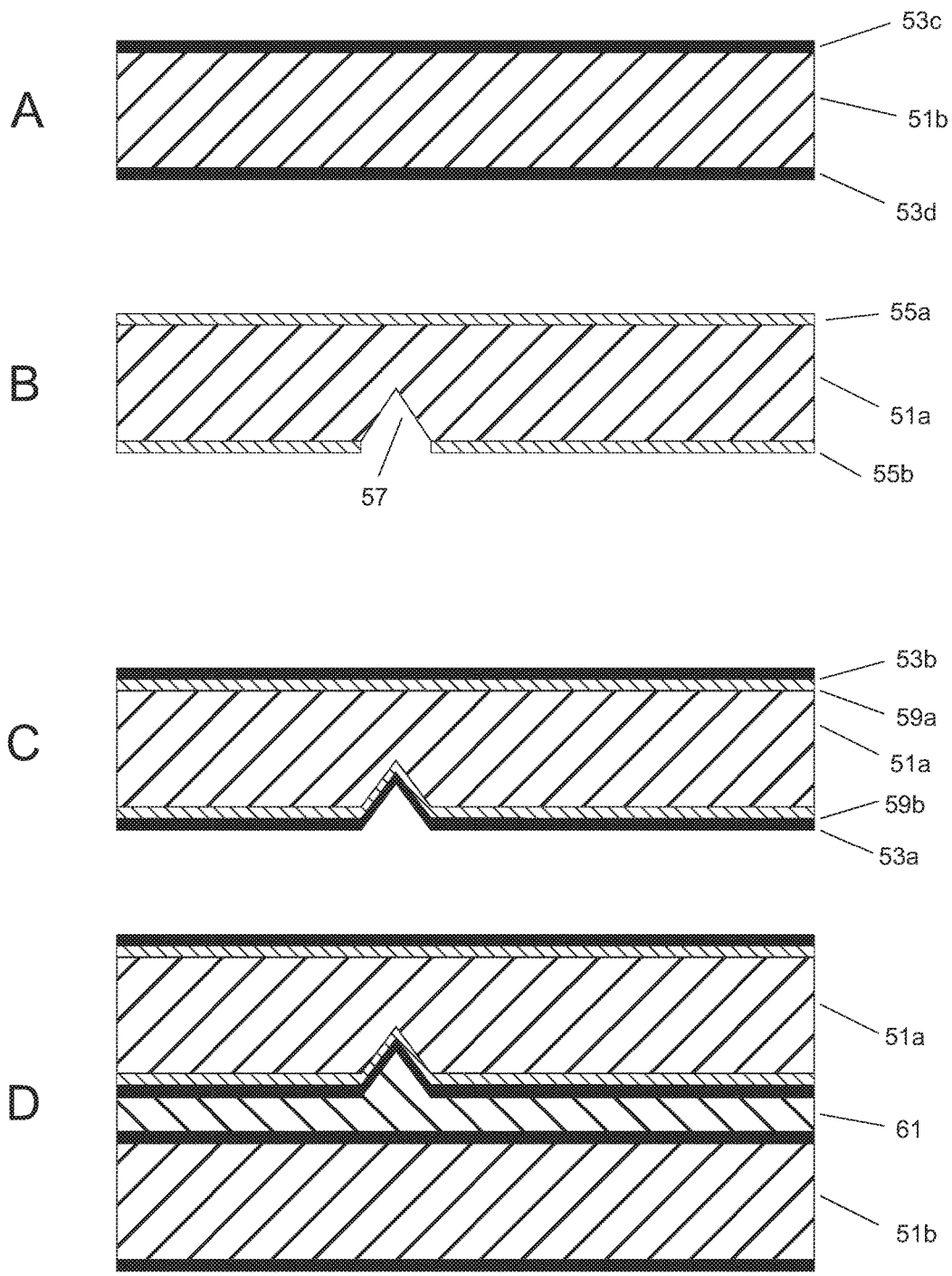
FIGS. 10a and 10b illustrate a fabrication process towards integration of self-sensing elements onto an external surface of the cantilever according to another aspect of the present invention.
Figure 10B:
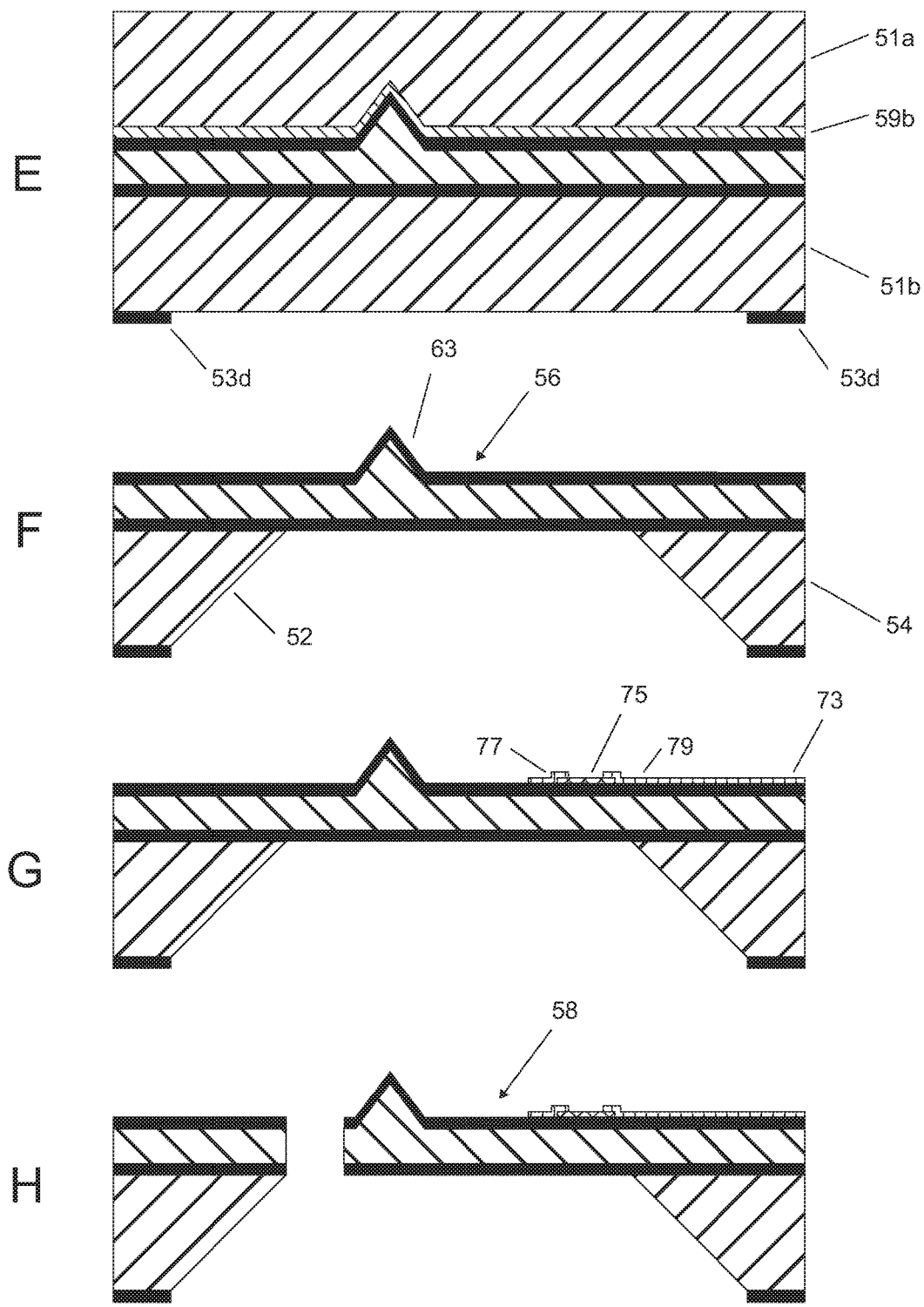

FIGS. 10a and 10b present an overview of a process for integrating both a moulded sharp tip and electrical deflection sensing elements onto the upper outer surface of the cantilever device.

FIG. 10, steps A-F follow the description given for steps A-F of FIG. 8.

In FIG. 10 step G, strain sensor element 75 and electrical connections 77 and 79 are deposited (or deposited and patterned) as described in FIG. 9 step A. An area to make electrical connections 73 to further instrumentation off the cantilever chip can be included as part of the definition of the electrical connection 79.

FIG. 10 step H follows the description from step G in FIG. 8.

Figure 11A:
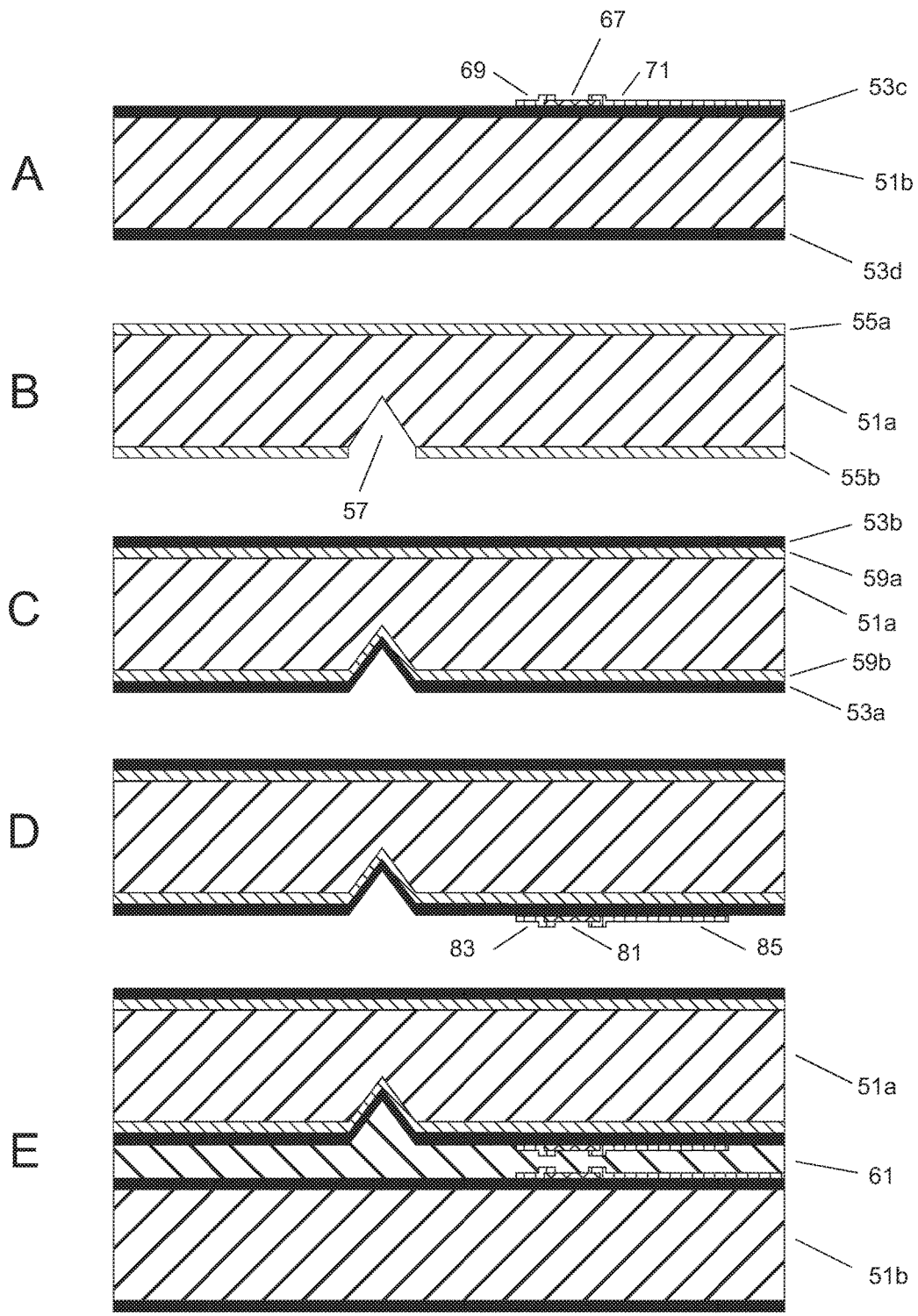
FIGS. 11a and 11b show a fabrication process towards integration of self-sensing elements onto both upper and lower internal surfaces of the cantilever according to yet another aspect of the present invention.
Figure 11B:
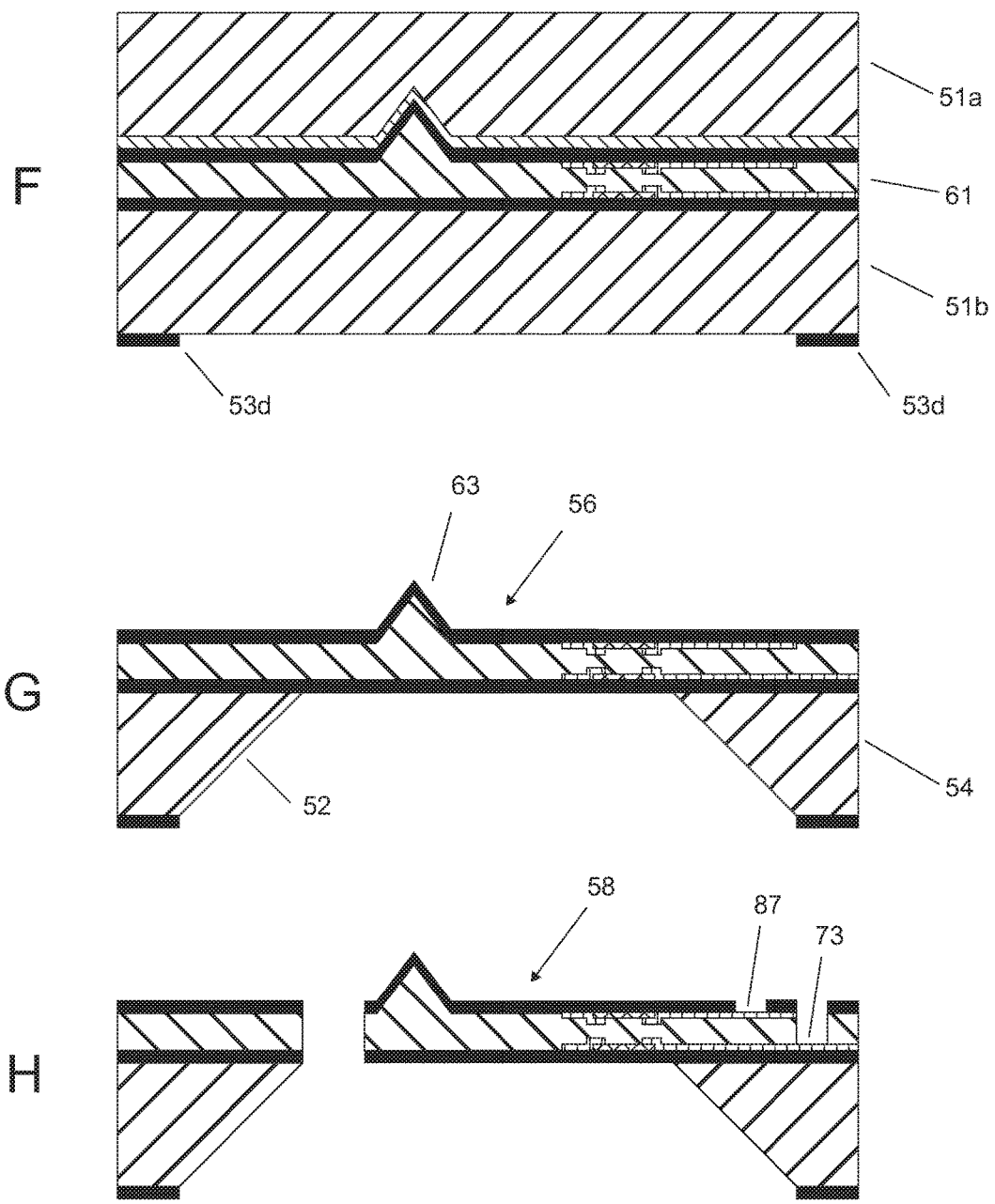

FIGS. 11a and 11b present an overview of a process for integrating both a moulded sharp tip and electrical deflection sensing elements onto two inner surfaces of the composite sandwich cantilever device.

FIG. 11 step A is performed according to the description in step A of FIG. 9.

FIG. 11 steps B-C follow the description given for steps B-C of FIG. 8.

In FIG. 11 step D, on wafer 51a from step C, strain sensor element 81 and electrical connections 83 and 85 are deposited (or deposited and patterned) according to the description in FIG. 9 step A.

FIG. 11 steps E-G are performed according to the description in steps D-F of FIG. 8.

FIG. 11 step H is performed according to the description in FIG. 9, step G. Opening 87 to connection 85 as well as opening 73 to connection 71 must both be made, according to description in FIG. 9 step G. These openings may be created serially or as part of one etching process step.

Figure 12A:
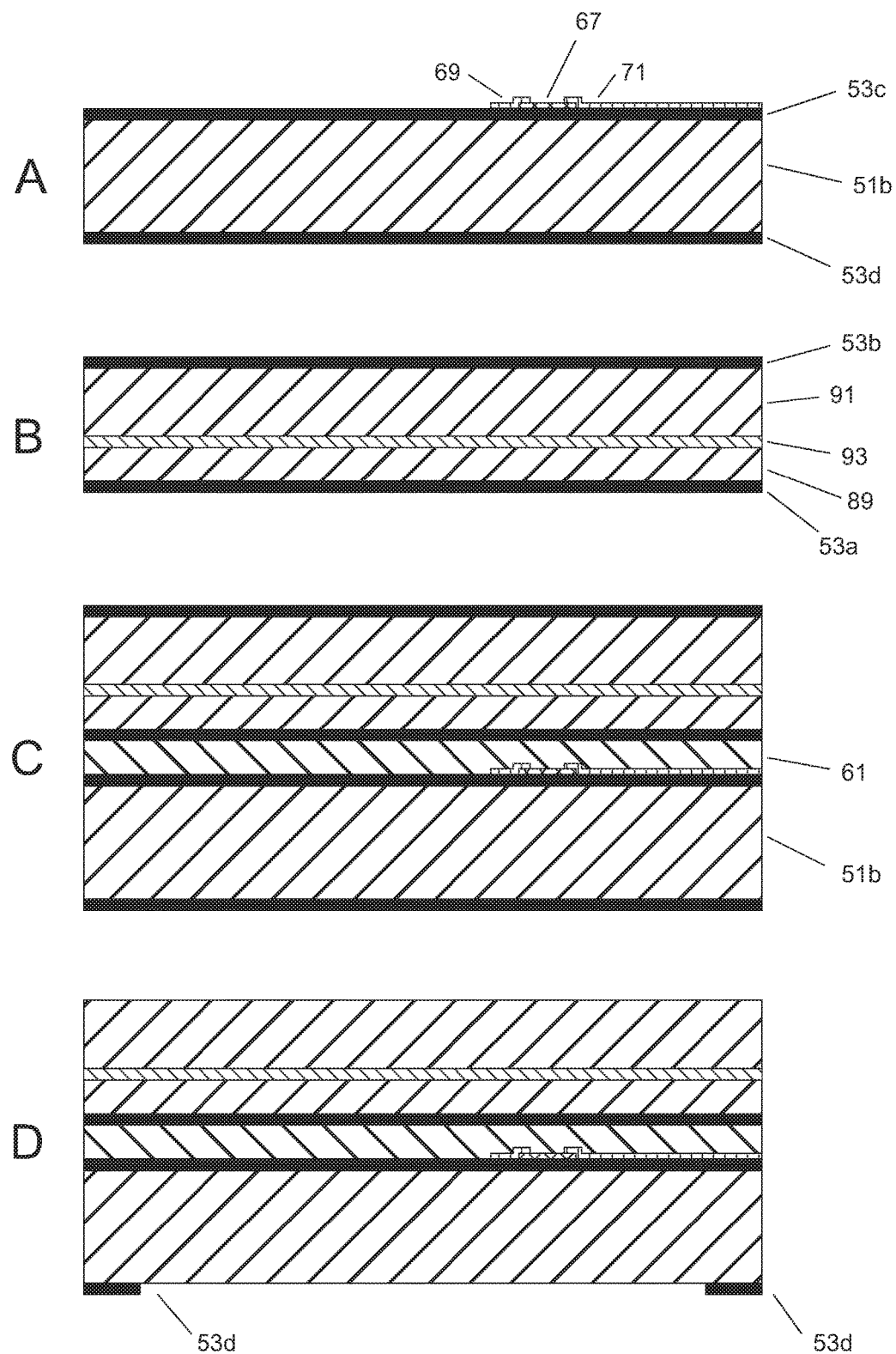
FIGS. 12a and 12b illustrate a fabrication process towards integration of a sharp silicon tip into a self-sensing cantilever according to further aspect of the present invention.
Figure 12B:
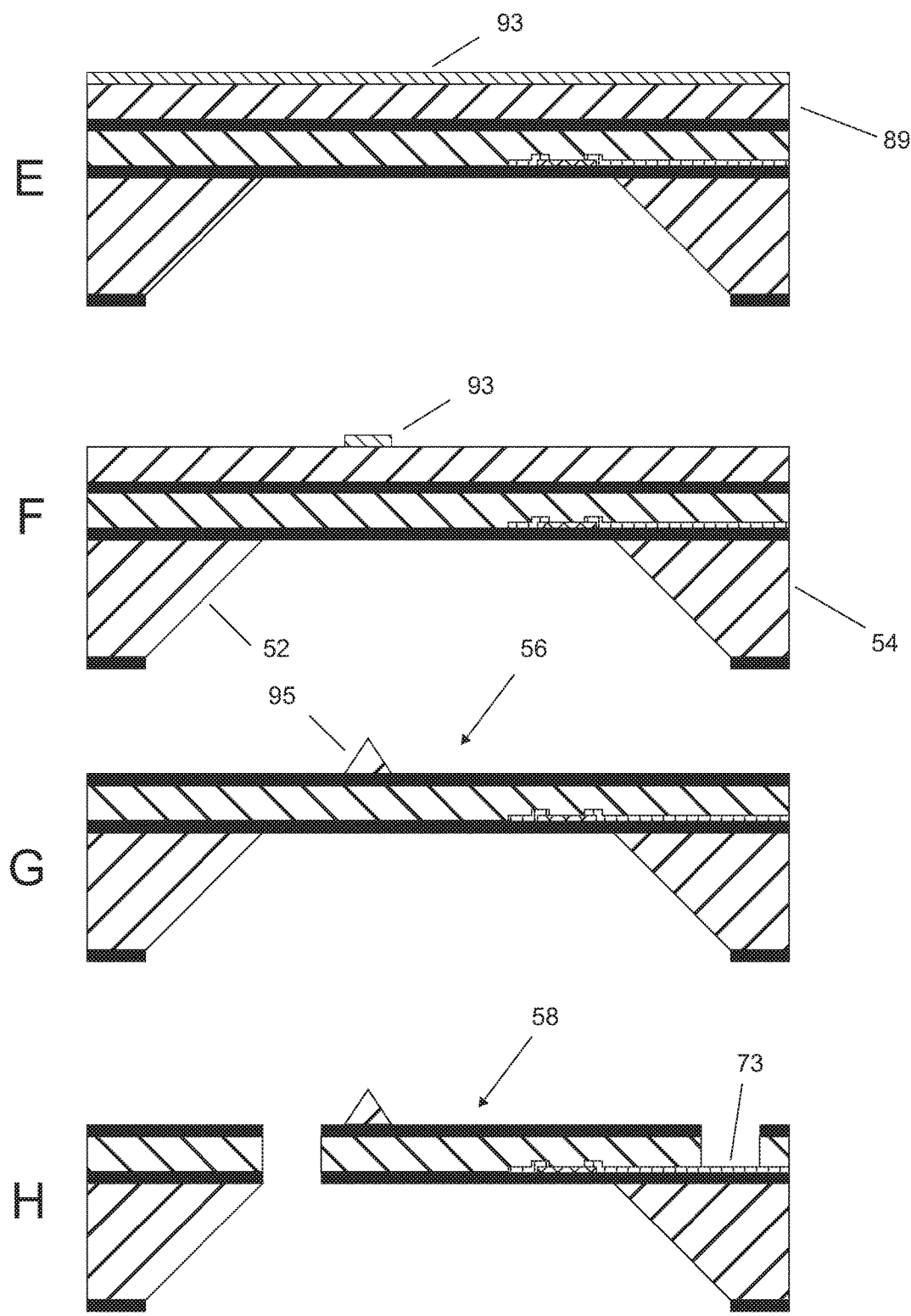

Alternative tip integration strategies beyond a moulded tip are desirable. FIGS. 12a and 12b present an overview of a process for integrating both an etched sharp silicon tip and electrical deflection sensing elements onto one inner surface of the composite sandwich cantilever device.

FIG. 12 step A is performed as is described in step A of FIG. 8.

In FIG. 12 step B, the process is shown using an SOI wafer consisting of two silicon layers 89 and 91 separated by a silicon dioxide layer 93. The thickness of layer 89 is from about 5 µm up to 50 µm, and is related to the desired final height of the silicon tip. On the SOI wafer, a layer 95 is grown or deposited according to the description in FIG. 8, step A. An SOI wafer is not strictly necessary for this process, but is a matter of convenience for defining the thickness of layer 89. On this wafer, layers 53a and 53b are grown or deposited according to the description in FIG. 8, step A.

In FIG. 12 step C, the wafer from step A and step B are bonded together using an intermediate polymer layer 61 according to FIG. 8, step D.

FIG. 12 step D is performed as is described in FIG. 8, step E.

In FIG. 12 step E, an etch is performed according to the description of FIG. 6 step C, in order to remove or partially remove layer 91 and wafer 51b. Layer 93 in the SOI wafer serves as an etch stop in this process to help define the thickness of layer 89. If not using an SOI wafer, the etch could be timed in order to leave a layer 89 of desired thickness, and subsequently, a layer 93 that serves subsequently as a wet etch mask could be deposited on the wafer using any low-temperature process, for example using PECVD to deposit silicon oxide or nitride, or evaporated Cr/Au. The remaining sections of wafer 51b form a remaining support structure 52 and the chip body 54.

In FIG. 12 step F, layer 93 is partially removed using lithography and a dry or wet etch.

In FIG. 12 step G, layer 89 is etched using the patterned layer 93 as a mask, in order to leave a sharp tip structure 95 on the released composite membrane 56. This etch can be, for example a wet etch using KOH or other anisotropic etchant as is commonly done (e.g. using a triangular mask) for the fabrication of sharp tip structures in silicon.

FIG. 12 step H is performed according to FIG. 9, step G.

Figure 13A:
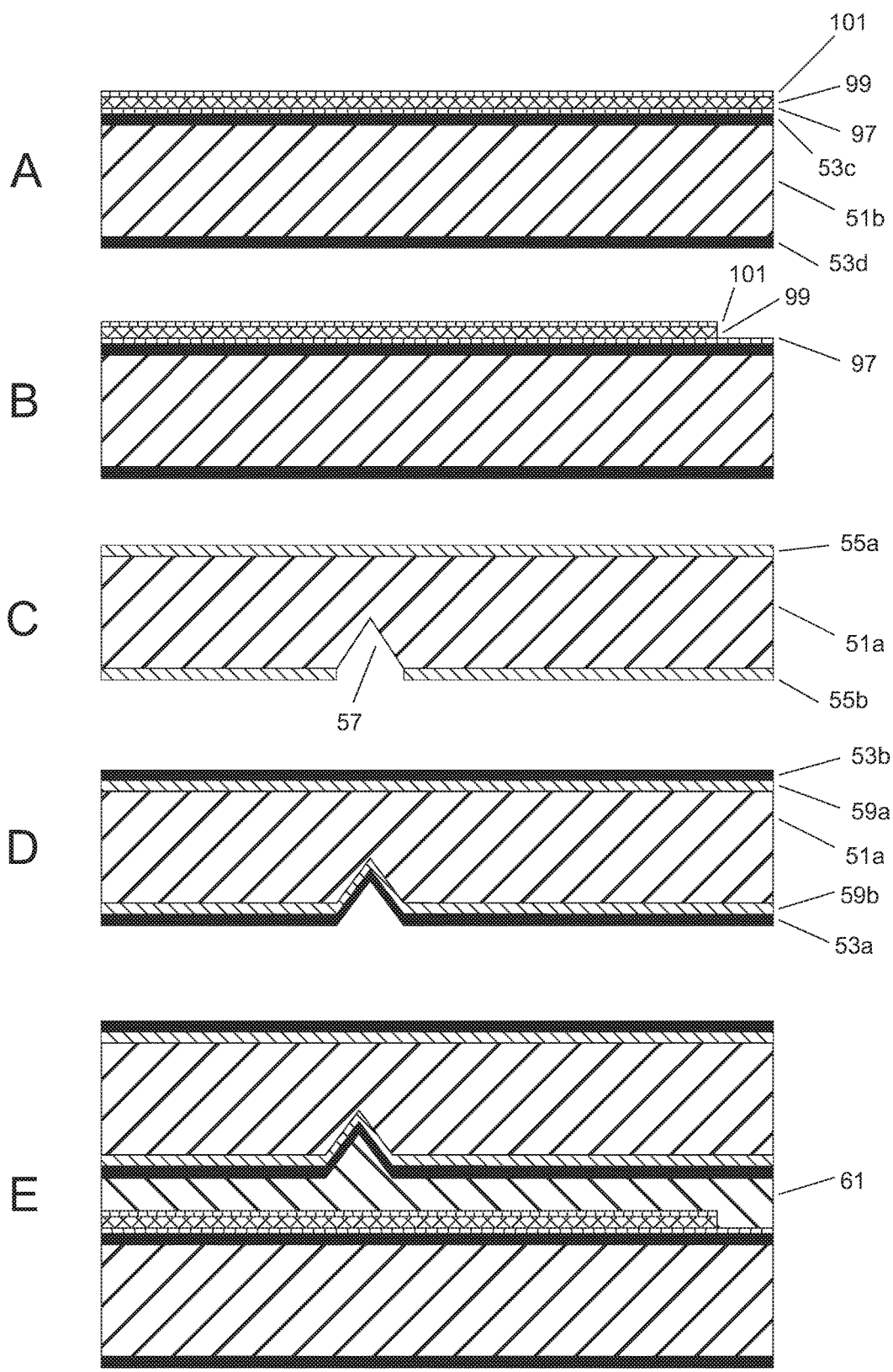
FIGS. 13a and 13b illustrate a fabrication process towards a self-sensing cantilever with of piezoelectric self-sensing elements according to yet another aspect of the present invention.
Figure 13B:
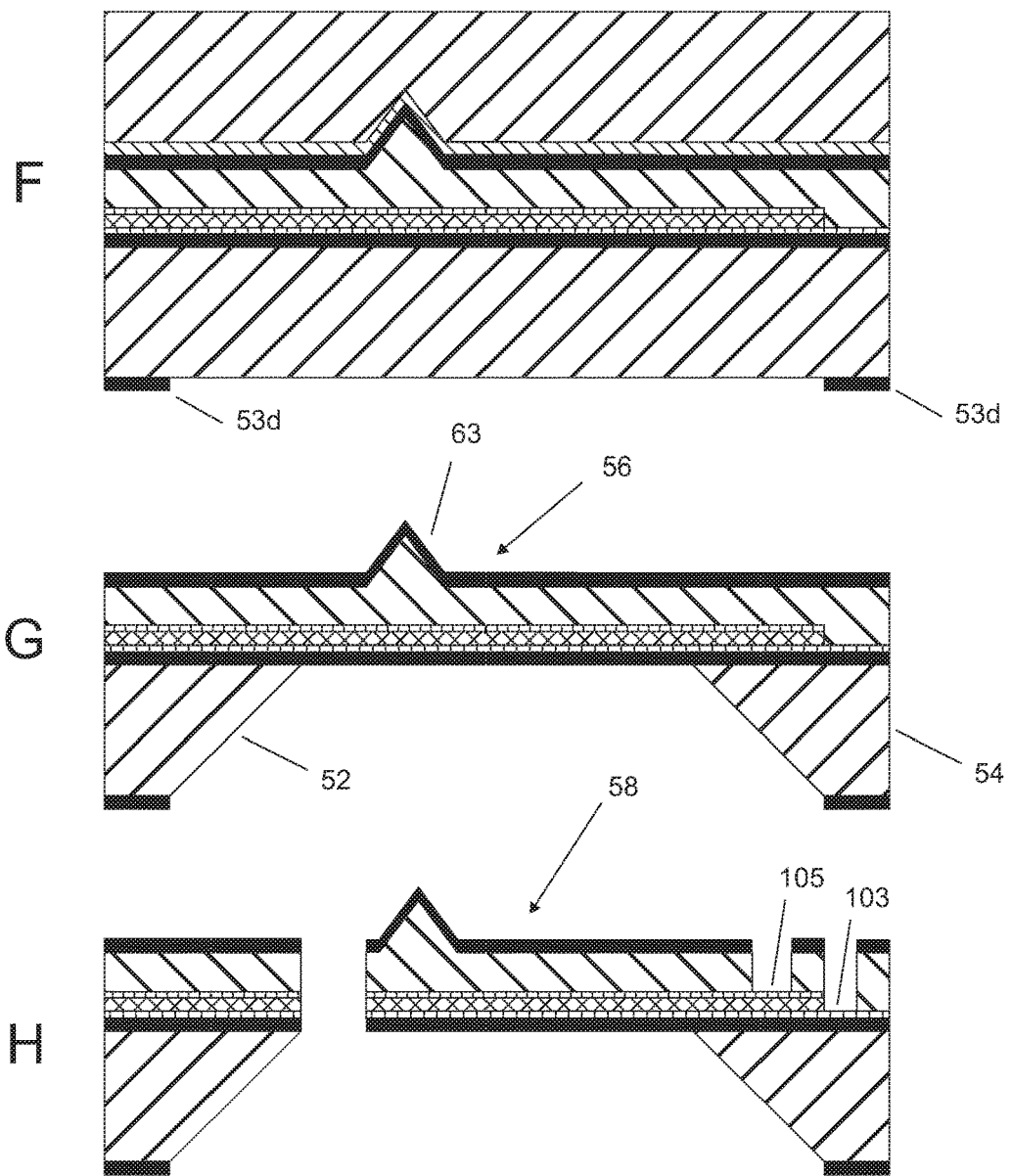

As described in relation to FIG. 4, different types of self-sensing strategies can be integrated into the cantilever. FIGS. 13a and 13b presents an overview of a process for integrating both a moulded sharp tip and piezoelectric deflection sensing elements onto one inner surface of the composite sandwich cantilever device.

FIG. 13a, step A is performed according to the description in FIG. 8, step A to create on wafer 51b layers 53c and 53d. Subsequently, electrical contact layer 97, piezoelectric layer 99 and electrical contact layer 101 are grown or deposited successively. The piezoelectric layer could be made of a material like AlN, or PZT, or others. The thickness of this layer would depend upon the material but could range from a few hundred nm up to about 2 µm. The electrical contact layers would be typically made of a metal like gold, silver, platinum, aluminum, molybdenum, etc. or an alloy and would have a thickness from about 20 nm up to 200 nm.

In FIG. 13a step B, electrical contact layers 97 and 101 and piezoelectric layer 99 are lithographically patterned and etched in order to expose part of layer 97. In addition, the layers could be partially removed across the wafer if desired (for example, such that the layers do not extend completely across the planar area of the cantilever beam. The etch could be a dry or wet etch.

FIG. 13 steps C-D are performed according to the description of FIG. 8, steps B-C.

In FIG. 13 step E, wafers from step D and step B are bonded according to description of FIG. 8 step D.

FIG. 13 steps F-G are performed as is described for FIG. 8, steps E-F.

FIG. 13 step H follows the description of FIG. 9, step G. Openings 103 and 105 to both electrical contact layers 97 and 101 must be made.

Membrane Devices

In addition to cantilever-based devices, an alternative embodiment of the invention concerns membrane devices, or structured membranes such as doubly- or multiply-clamped beams, etc.

Figure 14A:
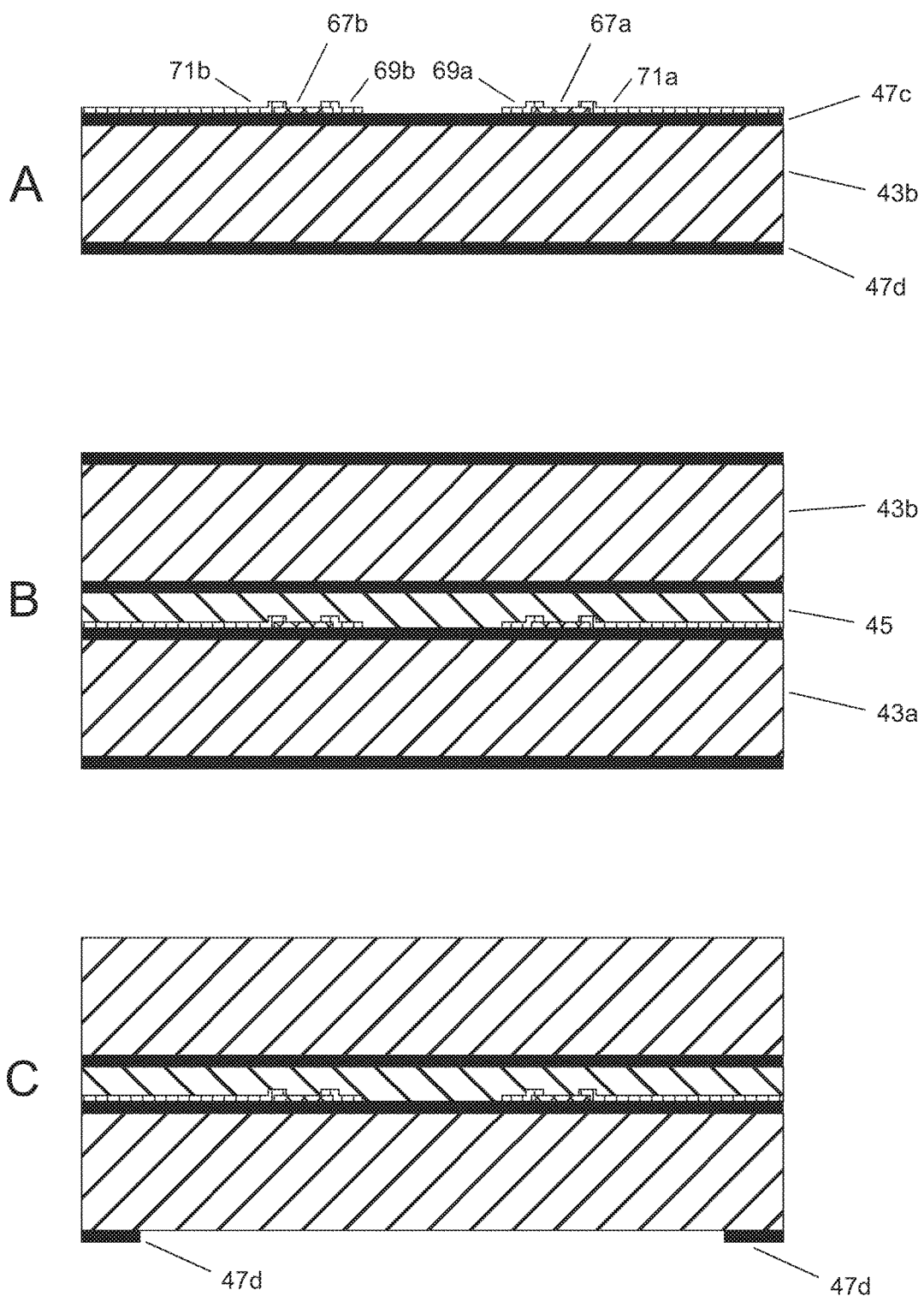
FIGS. 14a and 14b illustrate a fabrication process for a membrane-based multilayer device according to yet another aspect of the present invention.
Figure 14B:
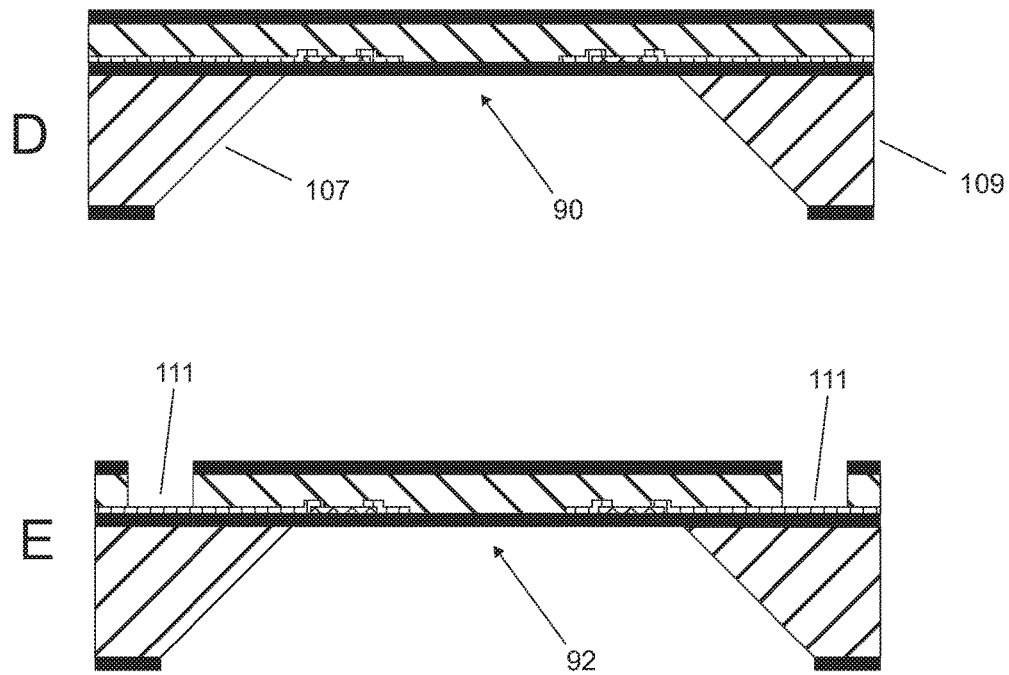

FIGS. 14a and 14b present an overview of a process for fabricating a device with electrical deflection sensing elements, where the device is a membrane instead of a cantilever. In the FIG., no tip-like structure is shown in the process, although one could be incorporated into the membrane following a process like that shown in FIG. 9, along the description below in order to make a membrane and not a cantilever.

In FIG. 14a step A, layers 47c and 47d are created on wafer 43a according to FIG. 6, step A. In addition, deflection sensing elements 67a and 67b with electrical contacts 69a, 69b, 71a and 71b are included as is described for FIG. 9, step A. Two elements are shown in the FIG., but more or fewer could be included as part of the process.

FIGS. 14a and 14b steps B-D are performed according to the description in FIG. 6 steps B-D, in order to release the composite membrane 90.

Figure 14C:
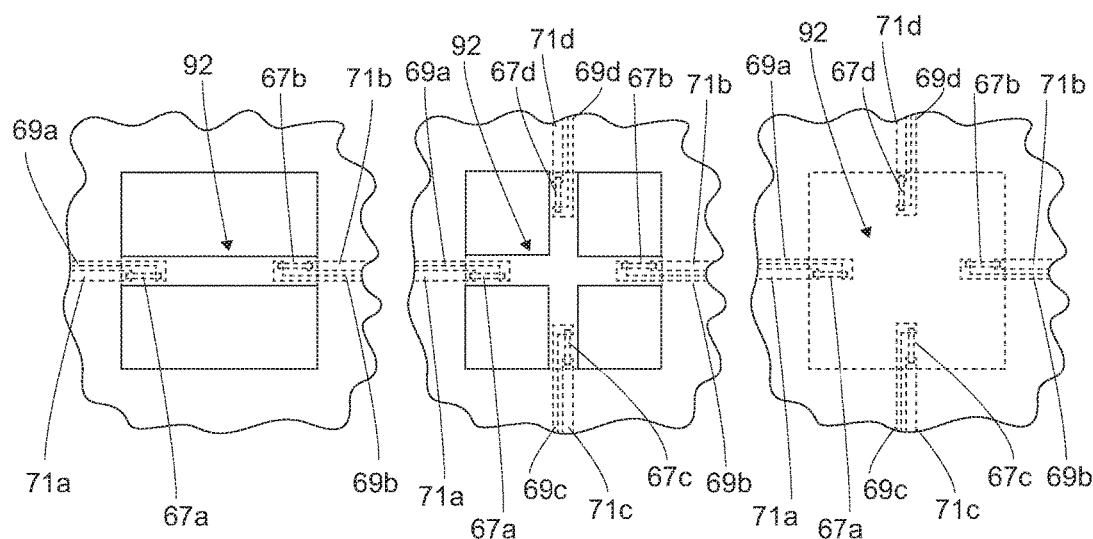
FIG. 14c illustrates a plurality of different membranes having different forms, such as a doubly-clamped beam, a crossed beam, or a full membrane.

In FIG. 14b step E, an etch is performed in order to define the (optionally) structured membrane 92 as is described in FIG. 9 step G. At minimum, openings 111 to the electrical contacts must be made during this etch. The membrane can be structured into a number of different shapes, such as a doubly-clamped beam, a crossed beam, or a full membrane as shown in FIG. 14c.

Alternative Layer Configurations

Figure 15:
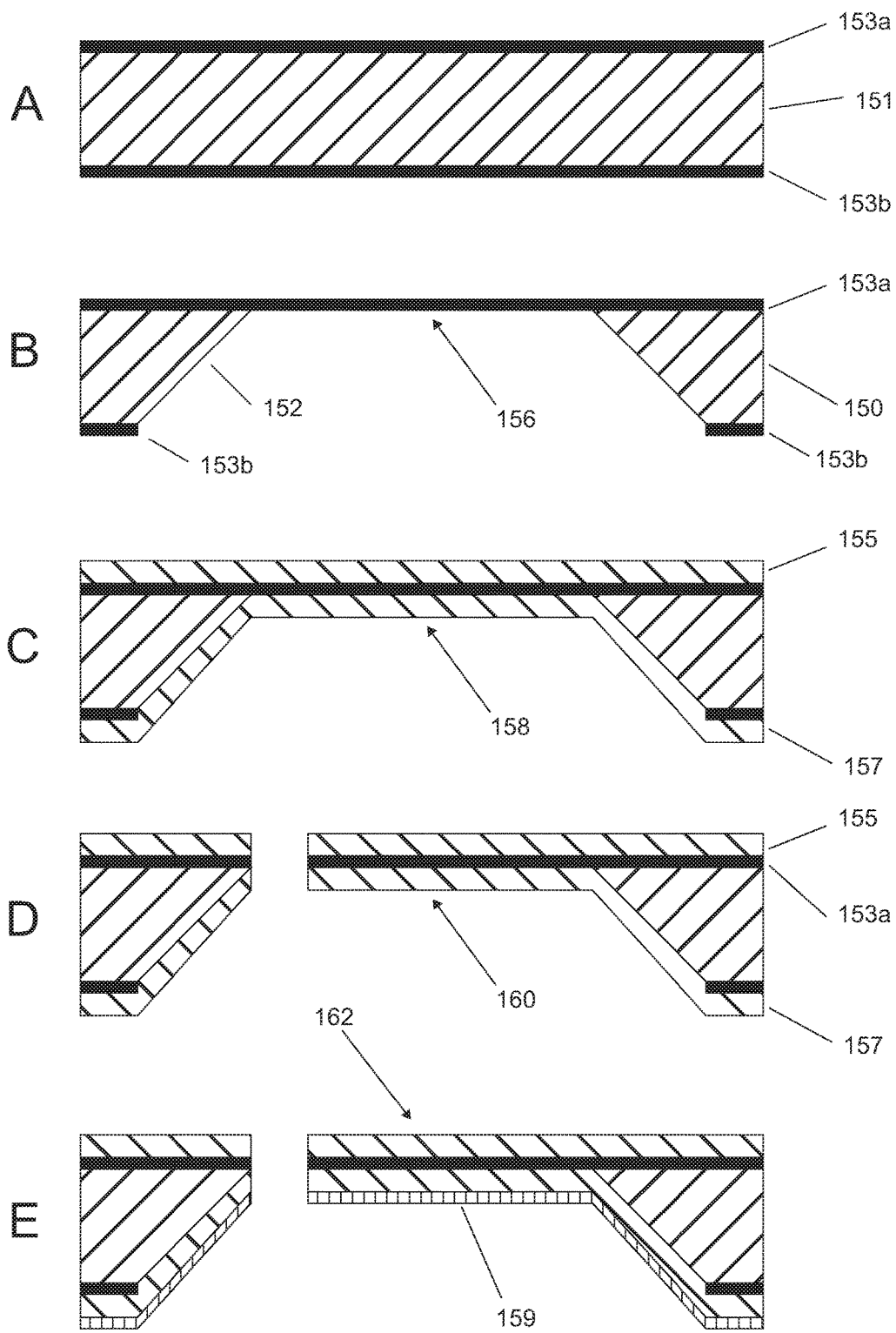
FIG. 15 shows an alternate configuration for a composite sandwich cantilever, a layer of high elastic modulus forms the core of the cantilever, with layers of low elastic modulus and high loss coefficient surrounding this core.

FIG. 15 presents an overview of an alternate configuration for a composite sandwich cantilever. In this embodiment of the invention, a layer of high elastic modulus forms the core of the cantilever, with layers of low elastic modulus and high loss coefficient surrounding this core. The core layer can for example include or be formed of any of the materials previously mentioned for the surrounding or sandwiching layers. The surrounding or sandwiching layers can for example include or be formed of any of the materials previously mentioned for the core layer. The advantage of this construction over the earlier-described embodiments is the relative simplicity of the fabrication process. This architecture would retain a benefit to the bandwidth ratio f0/Q through a reduction in the Q factor of the cantilever over a uniform cantilever, due to the inclusion of damping layers. However, the cantilever performance metric $f_0^2/k$ would not be improved through this architecture, because the layers with highest elastic modulus are close to the neutral axis.

In FIG. 15 step A, layers 153a and 153b on wafer 151 are created according to the description for FIG. 6 step A.

In FIG. 15 step B, layer 153b is partially removed through lithography and a wet or dry etch. Wafer 151 is then etched, using KOH or other etch process as described in FIG. 6 step D, in order to release the membrane 156 and define support structure 152 and chip body 150.

In FIG. 15 step C, layers 155 and 157 with low elastic modulus and high loss coefficient are deposited in order to define the composite membrane 158. These layers are ideally made of material and thickness as described in FIG. 6, step B for layer 45. The deposition process could be any number of conformal deposition processes, for example CVD or spray coating.

In FIG. 15 step D, layers 153a, 155 and 157 are etched in order to define the cantilever 160. This etch process is performed according to the description in FIG. 6, step E.

FIG. 15 step E is performed as is described for FIG. 6, step F.

Figure 16A:
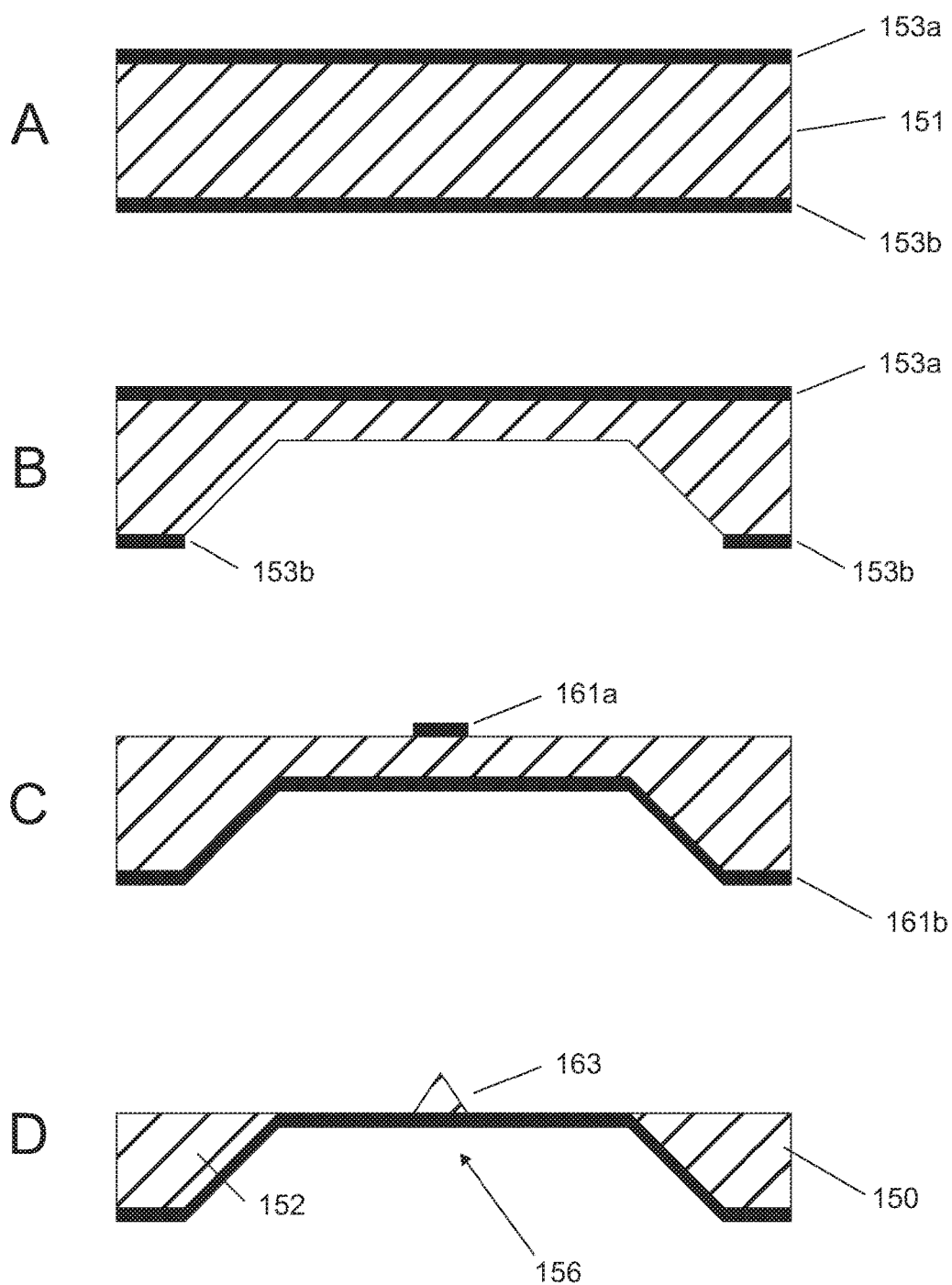
FIGS. 16a and 16b show a fabrication process for tip integration into the alternate cantilever configuration of FIG. 15.
Figure 16B:
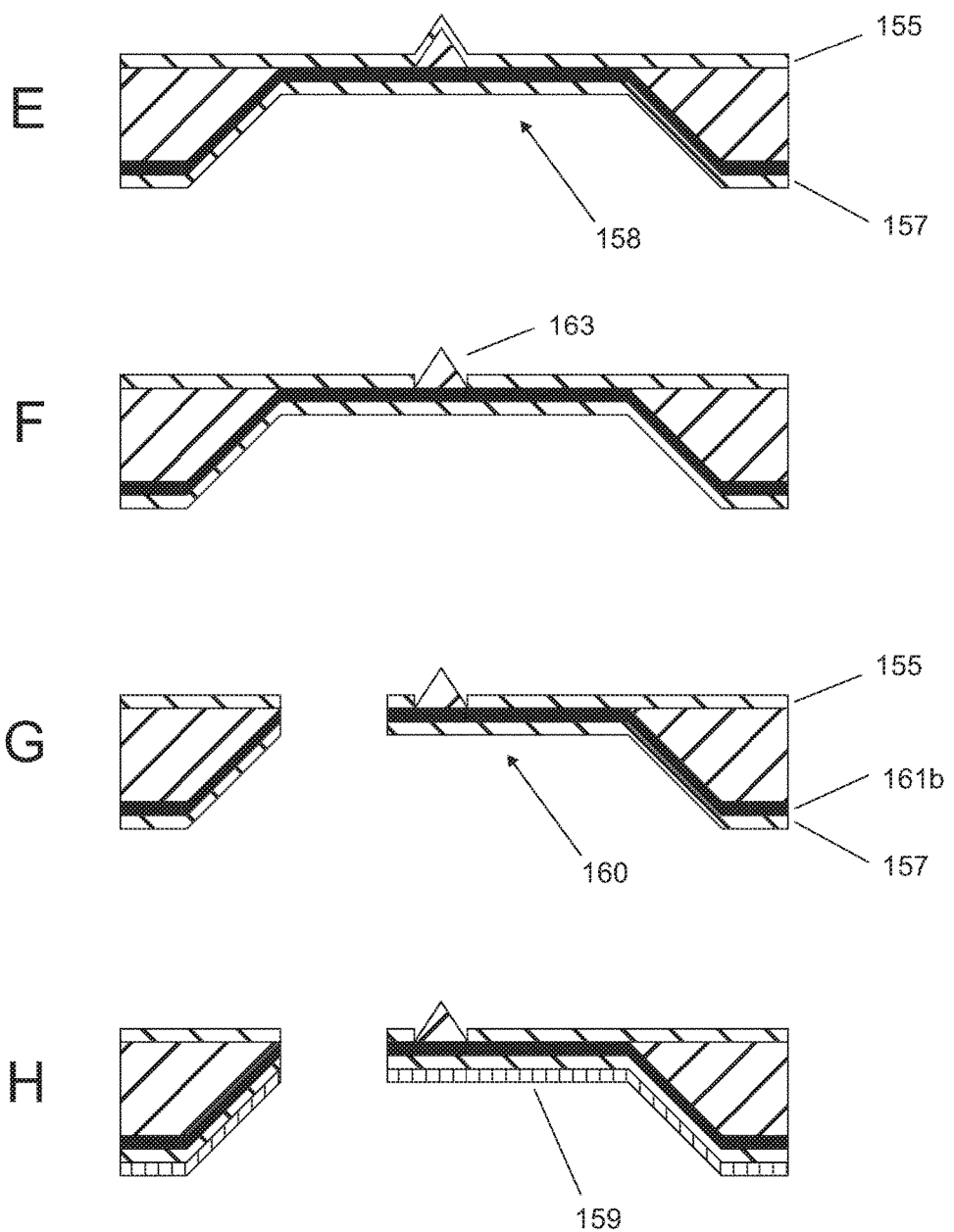

FIGS. 16a and 16b present an overview for the addition of a sharp tip on the cantilever architecture shown in FIG. 15. In step A, layers 153a and 153b are grown or deposited on silicon wafer 151. These layers could be silicon nitride or silicon oxide, with thickness from 100 nm up to 2 μm, depending on the layer material and the desired etch depth of the silicon wafer (in step B).

In FIG. 16a step B, layer 153b is patterned using lithography and a dry or wet etch. Subsequently, the wafer 151 is exposed to KOH or similar anisotropic etchant until the desired thickness of silicon wafer remains. This thickness is between about 5 and 50 μm depending on the specific tip geometry. Alternatively, an SOI wafer could be used to define the desired thickness of the remaining silicon wafer, stopping on the buried oxide layer (which may need to be subsequently removed).

In FIG. 16a step C, layers 153a and 153b are removed using a dry or wet etch. Layers 161a and 161b are then grown or deposited following the description of FIG. 6 step A. Layer 161a is patterned using lithography and a dry or wet etch to form a mask for the subsequent tip etch.

FIG. 16a step D is performed according to the description of FIG. 12, step G, to create sharp silicon tip structure 163 on released membrane 156, with remaining silicon wafer forming a support structure 152 and chip body 150.

FIG. 16b step E follows the description for FIG. 15, step C.

In FIG. 16b step F, layer 155 is removed in the region covering the tip using lithography combined with a dry or wet etch. The layer could be patterned using a photoresist or a hard mask.

FIG. 16b step G follows the description for FIG. 15, step D.

FIG. 16b step H is performed as is described for FIG. 6, step F.

Alternative Fabrication Process—Layer by Layer Deposition

FIGS. 17a, 17b, 17c and 17d present an overview of a process to create the cantilever using layer-by-layer deposition, as opposed to wafer bonding.

In FIG. 17 step A, layers 183a and 183b are grown or deposited on silicon wafer 181 as described for FIG. 6, step A.

In FIG. 17 step B, layer 185 is grown or deposited as described for FIG. 6, step B. Subsequently, layer 187 is grown or deposited. Layer 187 would have similar properties and thickness to layer 183a (ideally the same material and thickness). The process used to deposit layer 187 is dependent on the maximum temperature that the underlying layers (183a, most importantly 185) can withstand. Some polymers are able to withstand processes above 200-300° C, which would permit using deposition processes like PECVD, ALD, evaporation, sputtering, etc. in order to deposit layer 187.

In FIG. 17 step C, layer 183b is patterned using lithography and a dry or wet etch.

In FIG. 17 step D, silicon wafer 181 is exposed to KOH or similar anisotropic etchant to release composite membrane 184, leaving support structure 180 and chip body 182. Alternatively, a dry etch like DRIE could be used (see FIG. 6, step D for reference).

FIG. 17, steps E-F are performed following the description for FIG. 6, steps E-F.

Layer by Layer Deposition Implementation

Figure 17A:
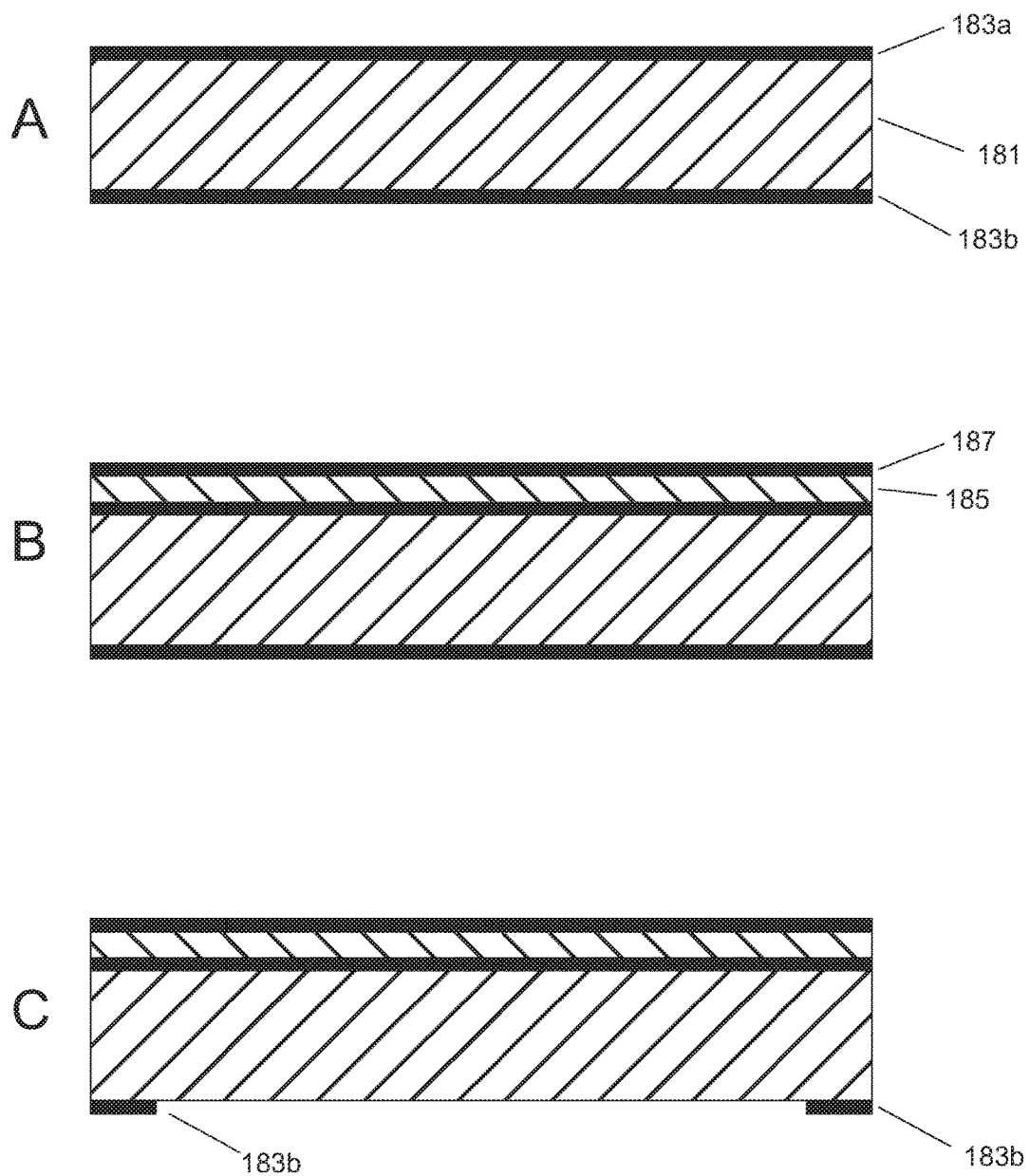
FIGS. 17a, 17b, 17c and 17d show a process for fabrication a cantilever using a layer-by-layer process according to yet another aspect of the present invention.
Figure 17B:
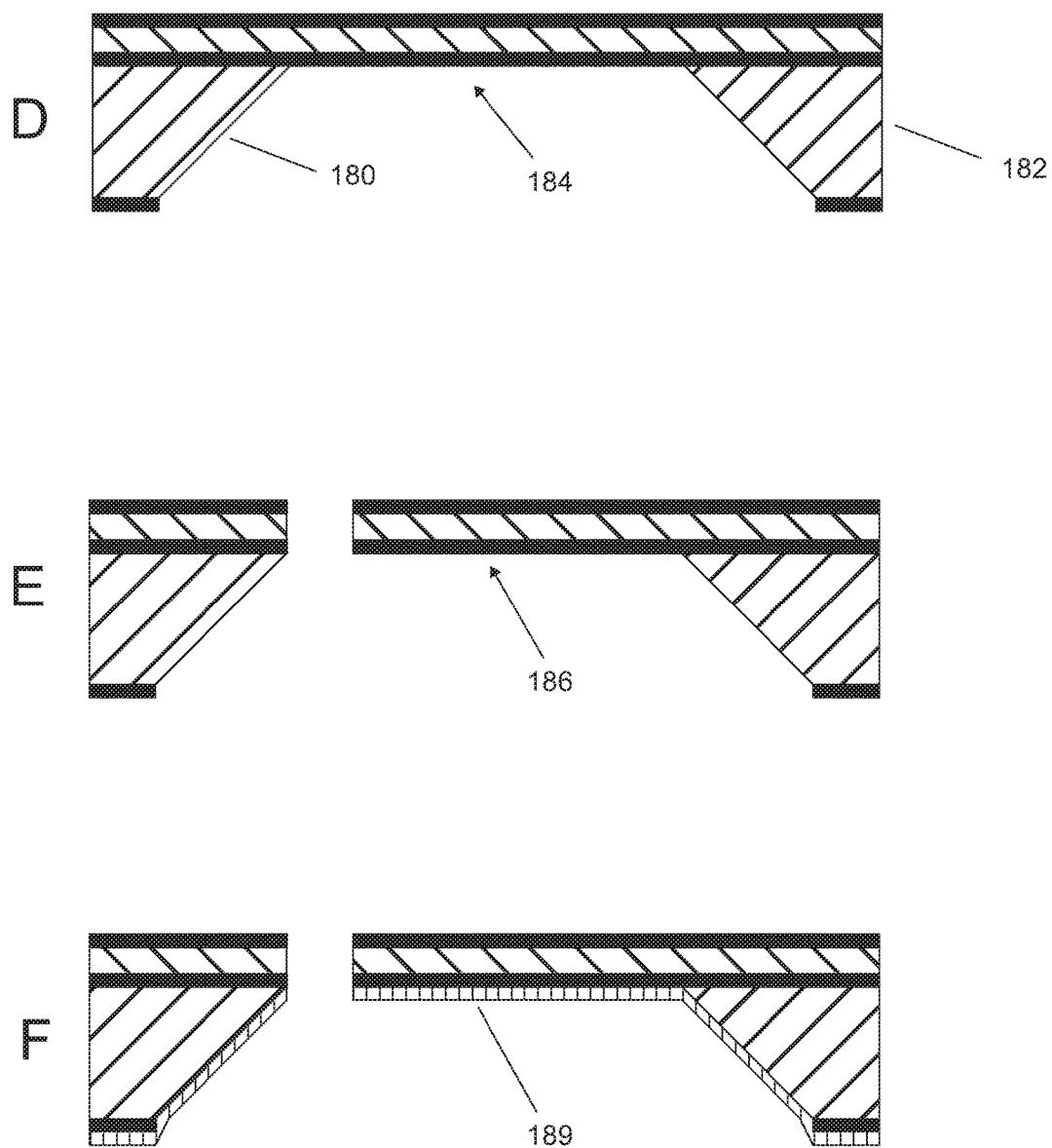
Figure 17C:
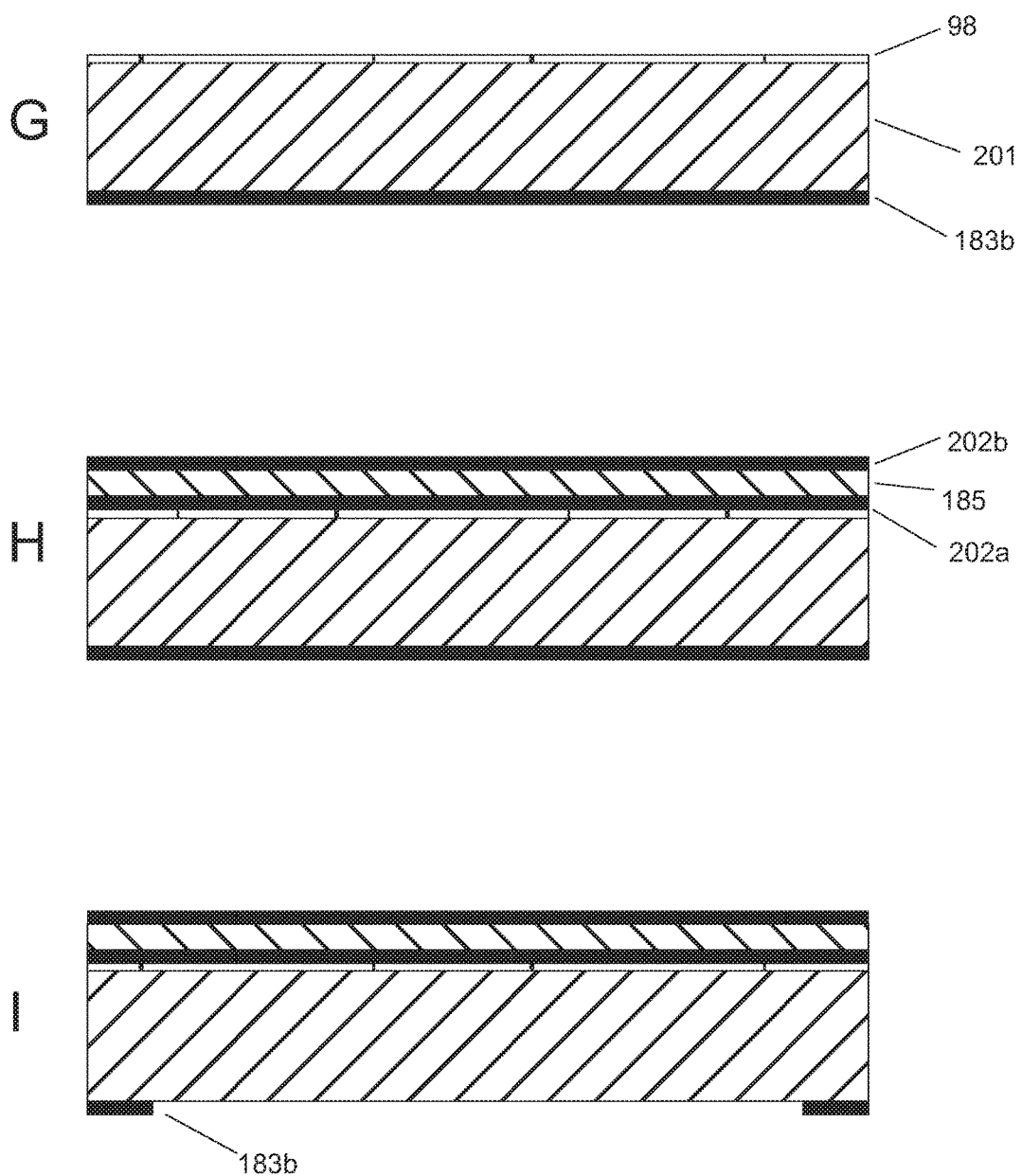
Figure 17D:
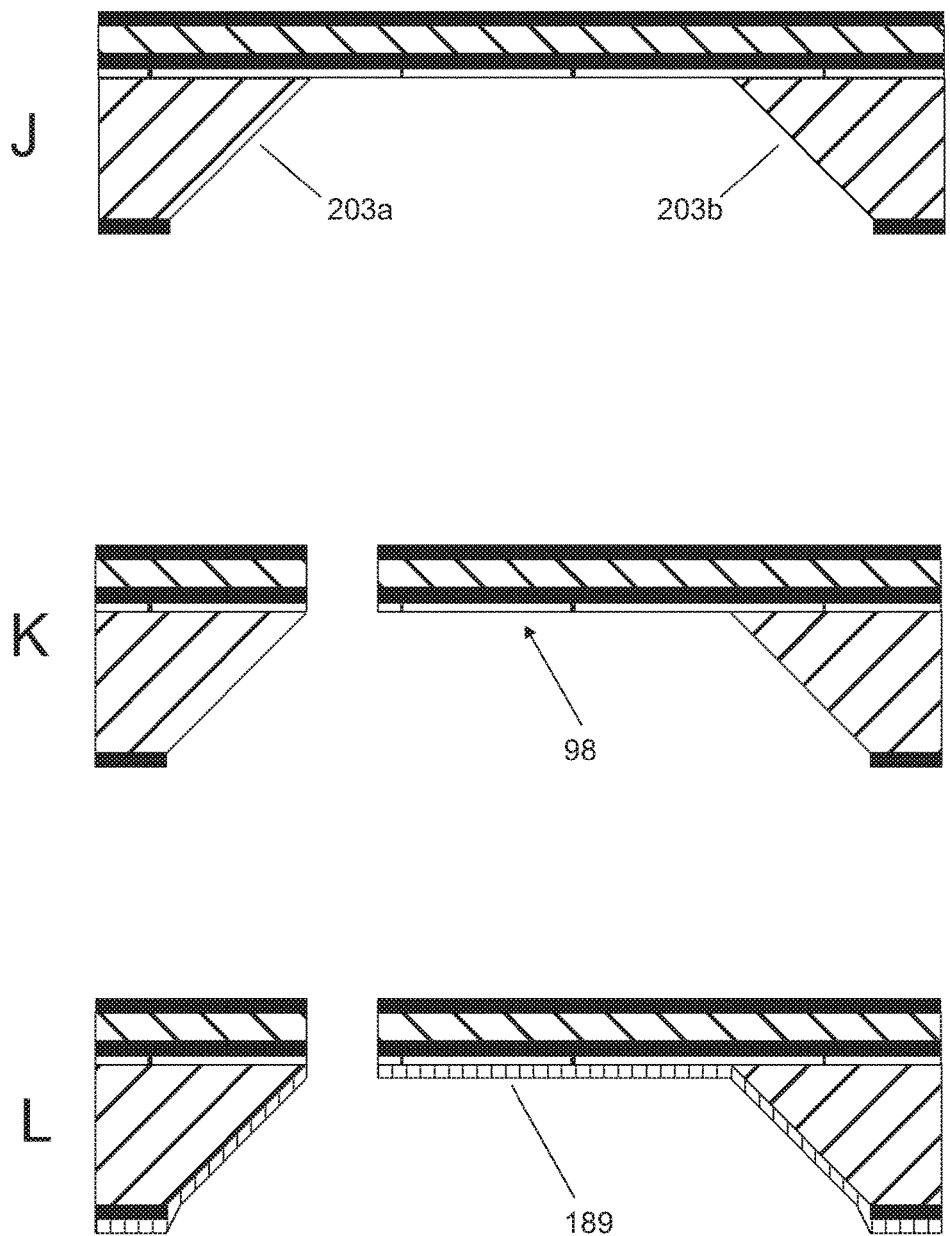

The process has been carried out by deposition of thin films with ALD (Atomic Layer Deposition) shown in FIGS. 17c and 17d. The advantages of ALD over other deposition processes like CVD, sputtering and thermal evaporation are low deposition temperature, convenient thin film quality, thickness control and material variety like $SiO_2$, $TiO_2$, $HfO_2$, $Al_2O_3$ and TiN. These advantages enable us to tune the quality factor of the cantilevers, however other deposition or growth methods can be used as well.

FIG. 17c step G demonstrates wafer 201 which consists of wafer 181 and layer 183b where layer 183a is stripped off by dry etching. Layer 98 is an etch stop layer like Al or Ti to protect the deposited thin film from KOH shown in FIG. 17 step D.

In FIG. 17c step H, layer 202a is deposited by ALD followed by coating layer 185 and then deposition of layer 202b by ALD.

FIG. 17 steps I and J are carried out as described previously in relation to steps C and D of FIG. 17.

In FIG. 17 step K the sandwich structure and layer 98 are etched followed by step L which is carried out as described in relation to step F of FIG. 17b.

Figure 18:
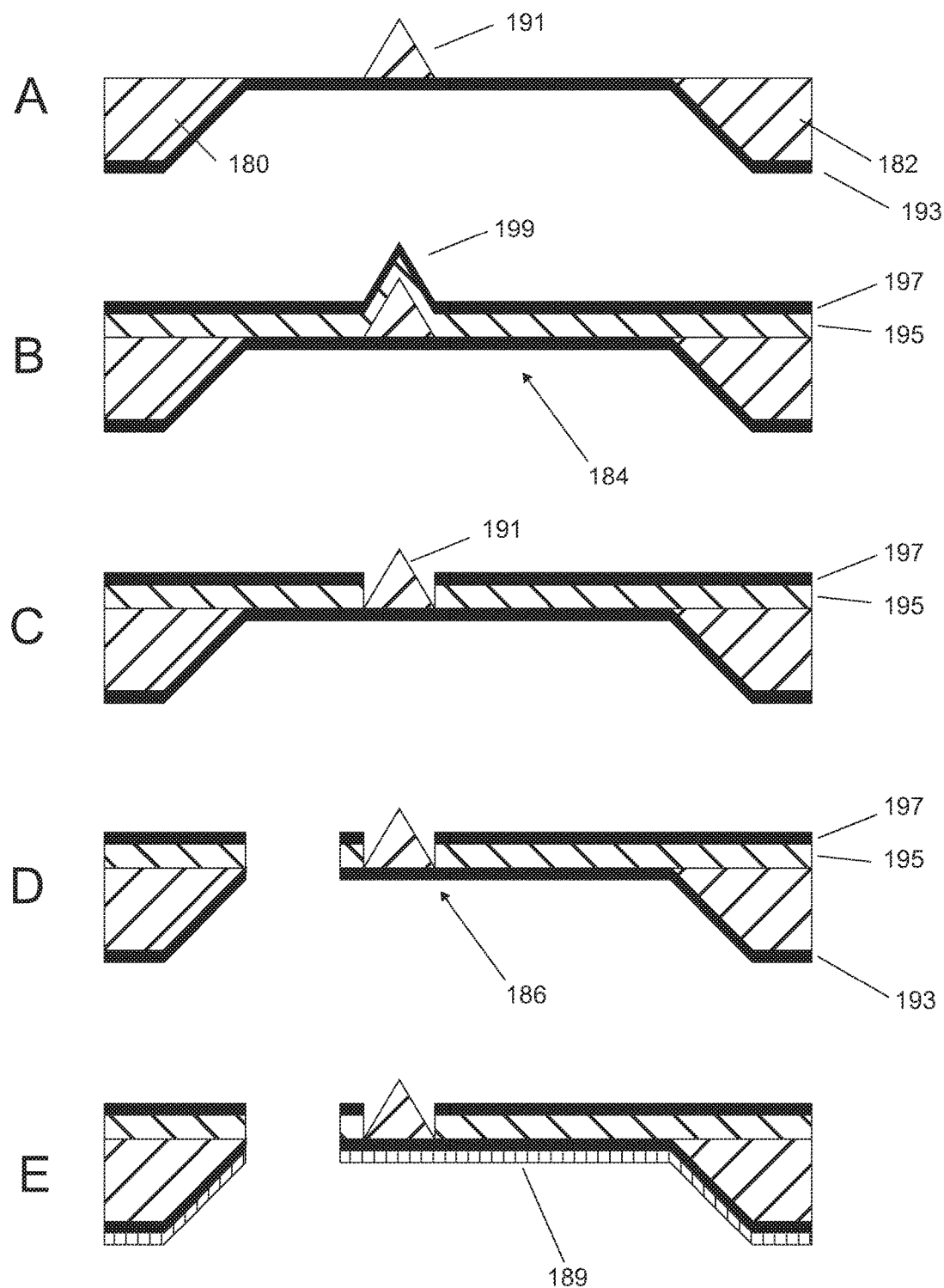
FIG. 18 illustrates a process for cantilever fabrication using a layer-by-layer process with integrated tip according to further another aspect of the present invention.

FIG. 18 presents an overview of a process to create the cantilever including a sharp tip structure using a layer-by-layer deposition.

The structure shown in FIG. 18 step A is achieved following the description for FIG. 16 steps A-D.

In FIG. 18 step B, layers 195 and 197 are deposited as described for FIG. 17, step B, forming the composite membrane 184.

In FIG. 18 step C, layers 195 and 197 are removed in the region covering the tip using lithography and a dry or wet etch, exposing the tip structure 191. The layers could be patterned using a photoresist or hard mask.

FIG. 18 steps D-E are performed following the description of FIG. 6, steps E-F.

Having described preferred embodiments of this invention, it will be apparent to one of skill in the art that other embodiments incorporating its concept may be used. This invention should not be limited to the disclosed embodiments, but rather should be limited only by the scope of the appended claims.

While the invention has been disclosed with reference to certain preferred embodiments, numerous modifications, alterations, and changes to the described embodiments, and equivalents thereof, are possible without departing from the sphere and scope of the invention. Accordingly, it is intended that the invention not be limited to the described embodiments, and be given the broadest reasonable interpretation in accordance with the language of the appended claims.

REFERENCES

1. Mertz, J., Marti, O. & Mlynek, J. Regulation of a microcantilever response by force feedback. *Appl. Phys. Lett.* 62, 2344-2346 (1993).
2. Walters, D. A. et al. Short cantilevers for atomic force microscopy. *Rev. Sci. Instrum.* 67, 3583-3590 (1996).
3. Ando, T. et al. A high-speed atomic force microscope for studying biological macromolecules. *Proc. Natl. Acad. Sci.* 98, 12468-12472 (2001).
4. Fantner, G. E. et al. Components for high speed atomic force microscopy. *Ultramicroscopy* 106, 881-887 (2006).
5. Viani, M. B. et al. Probing protein-protein interactions in real time. *Nat. Struct. Biol.* 7, 644-647 (2000).
6. Fantner, G. E., Barbero, R. J., Gray, D. S. & Belcher, A. M. Kinetics of antimicrobial peptide activity measured on individual bacterial cells using high-speed atomic force microscopy. *Nat. Nanotechnol.* 5, 280-285 (2010).
7. Uchihashi, T., Iino, R., Ando, T. & Noji, H. High-speed atomic force microscopy reveals rotary catalysis of rotorless F1-ATPase. *Science (80-.).* 333, 755-758 (2011).
8. Casuso, I. et al. Characterization of the motion of membrane proteins using high-speed atomic force microscopy. *Nat. Nanotechnol.* 7, 525-529 (2012).
9. Genolet, G. et al. Soft, entirely photoplastic probes for scanning force microscopy. *Rev. Sci. Instrum.* 70, 2398-2401 (1999).
10. Thaysen, J., Yalçinkaya, A., Vettiger, P. & Menon, A. Polymer-based stress sensor with integrated readout. *J. Phys. D. Appl. Phys.* 35, 2698-2703 (2002).
11. Calleja, M. et al. Highly sensitive polymer-based cantilever-sensors for DNA detection. *Ultramicroscopy* 105, 215-222 (2005).
12. Nordström, M. et al. SU-8 Cantilevers for Bio/chemical Sensing; Fabrication, Characterisation and Development of Novel Read-out Methods. *Sensors* 8, 1595-1612 (2008).
13. Mangonov, S. N. & Whangbo, M.-H. *Surface analysis with STM and AFM: experimental and theoretical aspects of image analysis. Surface analysis with STM and AFM: experimental and theoretical aspects of image analysis* (VCH, 1996).
14. Li, M., Tang, H. X. & Roukes, M. L. Ultra-sensitive NEMS-based cantilevers for sensing, scanned probe and very high-frequency applications. *Nat. Nanotechnol.* 2, 114-20 (2007).
15. Gotszalk, T., Grabiec, P., Tomerov, E. & Rangelow, I. W. Thermally driven micromechanical beam with piezoresistive deflection readout. 68, 550-556 (2003).
16. Ivanov, T., Gotszalk, T., Sulzbach, T., Chakarov, I. & Rangelow, I. W. A FM cantilever with ultra-thin transistor-channel piezoresistor: quantum confinement. 68, 534-541 (2003).
17. Linnemann, R. Characterization of a cantilever with an integrated. 264, (1995).
18. Manalis, S. R., Minne, S. C. & Quate, C. F. Atomic force microscopy for high speed imaging using cantilevers with an integrated actuator and sensor. *Appl. Phys. Lett.* 68, 871 (1996).
19. Lee, C., Itoh, T. & Suga, T. Self-excited piezoelectric PZT microcantilevers for dynamic SFM—with inherent sensing and actuating capabilities. *Sensors Actuators A* 72, 179-188 (1999).
20. Watanabe, S. & Fujii, T. Micro-fabricated piezoelectric cantilever for atomic force microscopy. *Rev. Sci. Instrum.* 67, 3898 (1996).
21. Lee, J. & King, W. P. Liquid Operation of Silicon Microcantilever Heaters. *IEEE Sens. J.* 8, 1805-1806 (2008).
22. King, W. P. Improved All-Silicon Microcantilever Heaters With Integrated Piezoresistive Sensing. *J. Microelectromechanical Syst.* 17, 432-445 (2008).
23. Lee, J. et al. Electrical, Thermal, and Mechanical Characterization of Silicon Microcantilever Heaters. *J. Microelectromechanical Syst.* 15, 1644-1655 (2006).
24. Brugger, J., Blamf, N., Renaudb, P. & Rooija, N. F. De. Microlever with combined integrated sensor/actuator functions for scanning force microscopy. 43, 339-345 (1994).
25. Adams, J. D. et al. Analysis of local deformation effects in resistive strain sensing of a submicron-thickness AFM cantilever, in *Proceedings of SPIE Microtechnologies, Smart Sensors, Actuators, and MEMS IV* 8763, 876327 (2013).
26. Pharr, G. M. & Oliver, W. C. Measurement of Thin Film Mechanical Properties Using Nanoindentation. (1992).
27. Xiang, Y., Chen, X. & Vlassak, J. J. Plane-strain Bulge Test for Thin Films. *J. Mater. Res.* 20, 2360-2370 (2011).
28. Weihs, T. P., Hong, S., Bravman, J. C. & Nix, W. D. Mechanical deflection of cantilever microbeams: A new technique for testing the mechanical properties of thin films. *J. Mater. Res.* 3, 931-942 (1988).
29. Le Rouzic, J., Delobelle, P., Vairac, P. & Cretin, B. Comparison of three different scales techniques for the dynamic mechanical characterization of two polymers (PDMS and SU8). *Eur. Phys. J. Appl. Phys.* 48, 11201 (2009).
30. Ayela, C., Heinrich, S. M., Josse, F. & Dufour, I. Resonant microcantilevers for the determination of the loss modulus of thin polymer films. *J. Microelectromechanical Syst.* 20, 788-790 (2011).
31. Huber, F., Lang, H. P., Backmann, N., Rimoldi, D. & Gerber, C. Direct detection of a BRAF mutation in total RNA from melanoma cells using cantilever arrays. *Nat. Nanotechnol.* 8, 125-9 (2013).

32. Yang, Y. et al. Batch-fabricated cantilever probes with electrical shielding for nanoscale dielectric and conductivity imaging. *J. Micromechanics Microengineering* 22, 115040 (2012).

33. Albrecht, T. R., Akamine, S., Carver, T. E. & Quate, C. F. Microfabrication of cantilever styli for the atomic force microscope. *J. Vac. Sci. Technol. A* 8, 3386-3396 (1990).

34. Burt, D. P., Dobson, P. S., Donaldson, L. & Weaver, J. M. R. A simple method for high yield fabrication of sharp silicon tips. *Microelectron. Eng.* 85, 625-630 (2008).

APPENDIX A

The table below presents a detailed runcard for parylene/nitride trilayer cantilevers with moulded nitrid tip.

Projet
Parylene/nitride AFM cantilevers
Substrates: silicon <100>, 100 mm, 380 um, double side, Prime, p type, 1-10 Ohmcm. 2 wafers

| Step N° | Description | Equipement | Program/Parameters | Target | Actual | Remarks | Name | Date |
|---|---|---|---|---|---|---|---|---|
| 1 | Oxide deposition - tip wafter | | | | | | | |
| 1.1 | RCA1 clean | Z3/WB_PreOx_Clean | H2O:NH4OH:H2O2 (5:1:1) | 15 min 75° C. | | CMi staff to perform | | |
| 1.2 | HF dip | Z3/WB_PreOx_Clean | HF:H2O (1:10) | 15 s | | CMi staff to perform | | |
| 1.3 | RCA2 clean | Z3/WB_PreOx_Clean | H2O:HCl:H2O2 (6:1:1) | 15 min 75° C. | | CMi staff to perform | | |
| 1.4 | Fast fill rinse | Z3/WB_PreOx_Clean | | 15 min | | CMi staff to perform | | |
| 1.5 | Trickle tank | Z3/WB_PreOx_Clean | | 15 min | | CMi staff to perform | | |
| 1.6 | Spin rinser dryer | Z3/Semitool | Prog. 1 | | | CMi staff to perform | | |
| 1.7 | Wet oxidation | Z3/Centrotherm LPCVD | Wet oxide std process | 500 nm | | CMi staff to perform | | |
| 1.8 | Oxide thickness meas. | Z3/Nanospec/AFT6100 | | 500 nm | | | | |
| 2 | Photolithography - Backside registry mask - tip wafer | | | | | | | |
| 2.1 | Surface activation | Z11/Tepla 300 or Z2/Tepla GigaBatch | Program 4 (300) or Strip high 5 min (GigaBatch) | | | | | |
| 2.2 | Spin on | Z13/SSE SB20 | AZ1512HS, STD-4000-RPM | 1.2 um | | Dispense ~3 mL resist | | |
| 2.3 | PR bake | Z13/SSE SB20 | 100° C. on hotplate | 1 min | | | | |
| 2.4 | Expose | Z13/MJB4 | Hard contact, CP mode | 3 sec | | for 20 mW/cm2 i-line intensity | | |
| 2.5 | PR develop | Z13/Develop bench | MFCD26 | 30 sec | | | | |
| 2.6 | DI Rinse | Z13/Develop bench | 3 fill-exchanges | | | | | |
| 2.7 | N2 dry | Z13/Develop bench | | | | | | |
| 2.8 | Inspection | Z13/microscope | | | | | | |
| 2.9 | Descum | Z11/Tepla 300 or Z2/Tepla GigaBatch | Program 44 (300) or Strip low 20 sec (GigaBatch) | | | | | |
| 3 | Oxide dry etch backside registry - tip wafer | | | | | | | |
| 3.1 | Oxide dry etch | Z2/SPTS | SiO2 PR 5:1 | 500 nm | | Stop after EPD | | |
| 3.2 | Inspection | Z2/microscope | | | | | | |
| 4 | Resist strip - tip wafer | | | | | | | |
| 4.1 | O2 plasma | Z2/Tepla GigaBatch | Strip high 5 min | | | | | |
| 4.2 | 1165 | Z2/UFT resist | 5 min bath 1, 5 min bath 2, QDR, TT | | | | | |
| 4.3 | Spin rinser dryer | Z2/UFT resist | prog 1 | | | | | |
| 4.4 | Inspection | Z2/Visual | Visual inspection for resist residue | | | | | |
| 5 | Photolithography - Tip openings mask - tip wafer | | | | | | | |
| 5.1 | Surface activation | Z11/Tepla 300 or Z2/Tepla GigaBatch | Program 4 (300) or Strip high 5 min (GigaBatch) | | | | | |
| 5.2 | Spin on | Z13/SSE SB20 | AZ1512HS, STD-4000-RPM | 1.2 um | | Dispense ~3 mL resist | | |
| 5.3 | PR bake | Z13/SSE SB20 | 100° C. on hotplate | 1 min | | | | |
| 5.4 | Expose | Z6/MA6 | Hard contact, CP mode | 2.4 s | | for 10 mW/cm2 broadband | | |
| 5.5 | PR develop | Z13/Develop bench | MFCD26 | 30 sec | | | | |
| 5.6 | DI Rinse | Z13/Develop bench | 3 fill-exchanges | | | | | |
| 5.7 | N2 dry | Z13/Develop bench | | | | | | |
| 5.8 | Inspection | Z13/microscope | | | | | | |
| 5.9 | Descum | Z11/Tepla 300 or Z2/Tepla GigaBatch | Program 44 (300) or Strip low 20 sec (GigaBatch) | | | | | |
| 6 | Oxide dry etch tip openings - tip wafer | | | | | | | |
| 6.1 | Oxide dry etch | Z2/SPTS | SiO2 PR 5:1 | 500 nm | | Stop after EPD | | |
| 6.2 | Inspection | Z2/microscope | | | | | | |

APPENDIX A-continued

The table below presents a detailed runcard for parylene/nitride trilayer cantilevers with moulded nitrid tip.
Projet
Parylene/nitride AFM
cantilevers
Substrates: silicon <100>, 100 mm, 380 um, double side, Prime, p type, 1-10
Ohmcm. 2 wafers

| Step N° | Description | Equipement | Program/Parameters | Target | Actual | Remarks | Name | Date |
|---|---|---|---|---|---|---|---|---|
| 7 | Resist strip - tip wafer | | | | | | | |
| 7.1 | O2 plasma | Z2/Tepla GigaBatch | Strip high 5 min | | | | | |
| 7.2 | 1165 | Z2/UFT resist | 5 min bath 1, 5 min bath 2, QDR, TT | | | | | |
| 7.3 | Spin rinser dryer | Z2/UFT resist | prog 1 | | | | | |
| 7.4 | Inspection | Z2/Visual | Visual inspection for resist residue | | | | | |
| 8 | KOH Etching - tip pits - tip wafer | | | | | | | |
| 8.1 | HF dip | Z5/Plade Six Sigma | 1% HF, 30 sec | | | | | |
| 8.2 | FFR | Z5/Plade Six Sigma | 3 fill-exchanges | | | | | |
| 8.3 | KOH Etching | Z5/Plade Six Sigma | 40%, 60° C., control density 1.37 at 60° C. | 3.5 um | | perform 100% overetch | | |
| 8.4 | FFR | Z5/Plade Six Sigma | 3 fill-exchanges | | | | | |
| 8.5 | Neutralization | Z5/Plade Six Sigma | HCL room temp | 2 h | | | | |
| 8.6 | FFR | Z5/Plade Six Sigma | 3 fill-exchanges | | | | | |
| 8.7 | Air dry | Z5/Plade Six Sigma | | | | | | |
| 9 | Oxide strip - tip wafer | | | | | | | |
| 9.1 | BHF oxide etch | Z2/Plade oxide | BHF clean | 500 nm | | perform 50% overetch | | |
| 9.2 | FFR | Z2/Plade oxide | 3 fill-exchanges | | | check for hydrophobicity | | |
| 9.3 | TT | Z2/Plade oxide | | | | | | |
| 9.4 | SRD | Z2/Plade oxide | prog 1 | | | | | |
| 10 | Wet oxidation and low stress nitride deposition - tip water | | | | | | | |
| 10.1 | RCA1 clean | Z3/WB_PreOx_Clean | H2O:NH4OH:H2O2 (5:1:1) | 15 min 75° C. | | CMi staff to perform | | |
| 10.2 | HF dip | Z3/WB_PreOx_Clean | HF:H2O (1:10) | 15 s | | CMi staff to perform | | |
| 10.3 | RCA2 clean | Z3/WB_PreOx_Clean | H2O:HCl:H2O2 (6:1:1) | 15 min 75° C. | | CMi staff to perform | | |
| 10.4 | Fast fill rinse | Z3/WB_PreOx_Clean | | 15 min | | CMi staff to perform | | |
| 10.5 | Trickle tank | Z3/WB_PreOx_Clean | | 15 min | | CMi staff to perform | | |
| 10.6 | Spin rinser dryer | Z3/Semitool | Prog. 1 | | | CMi staff to perform | | |
| 10.7 | Oxide deposition | Z3/Centrotherm wet oxide | wet oxide 950° C. | 4000 A | | CMi staff to perform | | |
| 10.8 | Nitride deposition | Z3/Centrotherm LPCVD | Low stress nitride | 200 nm | | CMi staff to perform | | |
| 10.9 | Nitride thickness meas. | Z3/Nanospec/AFT6100 | | 200 nm | | | | |
| 11 | Nitride deposition - chip wafer | | | | | | | |
| 11.1 | RCA1 clean | Z3/WB_PreOx_Clean | H2O:NH4OH:H2O2 (5:1:1) | 15 min 75° C. | | CMi staff to perform | | |
| 11.2 | HF dip | Z3/WB_PreOx_Clean | HF:H2O (1:10) | 15 s | | CMi staff to perform | | |
| 11.3 | RCA2 clean | Z3/WB_PreOx_Clean | H2O:HCl:H2O2 (6:1:1) | 15 min 75° C. | | CMi staff to perform | | |
| 11.4 | Fast fill rinse | Z3/WB_PreOx_Clean | | 15 min | | CMi staff to perform | | |
| 11.5 | Trickle tank | Z3/WB_PreOx_Clean | | 15 min | | CMi staff to perform | | |
| 11.6 | Spin rinser dryer | Z3/Semitool | Prog. 1 | | | CMi staff to perform | | |
| 11.7 | Nitride deposition | Z3/Centrotherm LPCVD | Low stress nitride perform | 200 nm | | CMi staff to | | |
| 11.8 | Nitride thick. meas. | Z3/Nanospec/AFT6100 | | | | | | |
| 12 | Parylene deposition - chip and tip wafers | | | | | | | |
| 12.1 | Piranha clean | Z2/UFT piranha | 5 min bath 1, 5 min bath 2, QDR, TT | | | | | |
| 12.2 | Spin rinser dryer | Z2/UFT piranha | Prog. 1 | | | | | |
| 12.3 | Silanization | Z14/Solvent bench | Std process, instructions posted at bench | | | | | |
| 12.4 | UV tape protect | Z11/Powatec | Manual mounting. Avoid touching wafer surface | | | | | |

APPENDIX A-continued

The table below presents a detailed runcard for parylene/nitride trilayer cantilevers with moulded nitrid tip.
Projet
Parylene/nitride AFM
cantilevers
Substrates: silicon <100>, 100 mm, 380 um, double side, Prime, p type, 1-10 Ohmcm. 2 wafers

| Step N° | Description | Equipement | Program/Parameters | Target | Actual | Remarks | Name Date |
|---|---|---|---|---|---|---|---|
| 12.5 | Package for transfer | Material transfer zone | Fill out form and place wafers in parylene cabinet | | | use dedicated parylene I/O box | |
| 12.6 | Parylene deposition | Z10/Comelec | | 2 um | | CMi staff to perform | |
| 12.7 | Wafers back to cleanroom | Material transfer zone | | | | | |
| 13 | Parylene - Parylene bonding - chip and tip wafers | | | | | | |
| 13.1 | UV tape removal | Z11/Powatec | std process avoid touching parylene surface | | | | |
| 13.2 | O2 plasma | Z11/Tepla 300 or Z2/Tepla GigaBatch | prog 44 (15 sec) or Strip low 20 sec (GB) | | | | |
| 13.3 | HF dip | Z2/Plade oxide | HF:H2O (1:4) room temp | 20 s | | HF dip and oven dry untested, may improve bonding | |
| 13.4 | FFR | Z2/Plade oxide | | | | | |
| 13.5 | TT | Z2/Plade oxide | | | | | |
| 13.6 | SRD | Z2/Plade oxide | | | | | |
| 13.7 | Oven dry | Z6/Heraus | 150 deg C. 15 min | | | 12.2-12.7 done indivually right before bonding | |
| 13.8 | Parylene bonding | Z6/SB6 | prog adams_parylene_v1 (280 deg C. vac 30 min) | | | align flats by eye | |
| 14 | Photolithography - chip body openings - backside alignment | | | | | | |
| 14.1 | Surface activation | Z11/Tepla 300 or Z2/Tepla GigaBatch | Program 3 (300) or Strip high 1 min (GigaBatch) | | | | |
| 14.2 | Spin on | Z13/SSE SB20 | AZ1512HS, STD-4000-RPM | 1.2 um | | Dispense ~3 mL resist | |
| 14.3 | PR bake | Z13/SSE SB20 | 100° C. on hotplate | 1 min | | | |
| 14.4 | Expose | Z6/MA6 | Hard contact, CP mode, backside align | 2.4 s | | for 10 mW/cm2 broadband | |
| 14.5 | PR develop | Z13/Develop bench | MFCD26 | 30 sec | | | |
| 14.6 | DI Rinse | Z13/Develop bench | 3 fill-exchanges | | | | |
| 14.7 | N2 dry | Z13/Develop bench | | | | | |
| 14.8 | Inspection | Z13/microscope | | | | | |
| 15 | Dry etch - chip body openings | | | | | | |
| 15.1 | Nitride dry etch | Z2/SPTS | SiO2 PR 5:1 | 200 nm | | Use EPD, overetch is ok | |
| 15.2 | Inspection | Z2/microscope | | | | | |
| 16 | Resist strip - chip side | | | | | | |
| 16.1 | O2 plasma | Z2/Tepla GigaBatch | Strip high 1 min | | | | |
| 16.2 | 1165 | Z2/UFT resist | 5 min bath 1, 5 min bath 2, QDR, TT | | | | |
| 16.3 | Spin rinser dryer | Z2/UFT resist | prog 1 | | | | |
| 16.4 | Inspection | Z2/Visual | Visual inspection for resist residue | | | | |
| 17 | Photolithography - usuable disk - tip side | | | | | | |
| 17.1 | Surface activation | Z11/Tepla 300 or Z2/Tepla GigaBatch | Program 3 (300) or Strip high 1 min (GigaBatch) | | | | |
| 17.2 | Spin on | Z13/SSE SB20 | AZ1512HS, STD-4000-RPM | 1.2 um | | Dispense ~3 mL resist | |
| 17.3 | PR bake | Z13/SSE SB20 | 100° C. on hotplate | 1 min | | | |
| 17.4 | Expose | Z6/MA6 | Hard contact, CP mode, | 2.4 s | | for 10 mW/cm2 broadband | |
| 17.5 | PR develop | Z13/Develop bench | MFCD26 | 30 sec | | | |
| 17.6 | DI Rinse | Z13/Develop bench | 3 fill-exchanges | | | | |
| 17.7 | N2 dry | Z13/Develop bench | | | | | |
| 17.8 | Inspection | Z13/microscope | | | | | |
| 18 | Dry etch - usable disk opening | | | | | | |
| 18.1 | Nitride/oxide dry etch | Z2/SPTS | SiO2 PR 5:1 | 400 nm/ 200 nm | | Use EPD, overetch is ok | |
| 18.2 | Inspection | Z2/microscope | | | | | |
| 19 | KOH etching - Si bulk removal and membrane release | | | | | | |
| 19.1 | SS Chuck mounting | Z5/Plade Six Sigma | | 150 um | | | |
| 19.2 | KOH Etching | Z5/Plade Six Sigma | 40%, 60° C., control density to 1.37 at 60° C. | 380 um | | overnight etch approx 18 h | |
| 19.3 | FFR | Z5/Plade Six Sigma | 3 fill-exchanges | | | | |
| 19.4 | Neutralization | Z5/Plade Six Sigma | HCL room temp | 2 h | | | |
| 19.5 | FFR | Z5/Plade Six Sigma | 3 fill-exchanges | | | | |
| 19.6 | Air dry | Z5/Plade Six Sigma | | | | dry overnight | |

APPENDIX A-continued

The table below presents a detailed runcard for parylene/nitride trilayer cantilevers with moulded nitrid tip.
Projet
Parylene/nitride AFM
cantilevers
Substrates: silicon <100>, 100 mm, 380 um, double side, Prime, p type, 1-10
Ohmcm. 2 wafers

| Step N° | Description | Equipement | Program/Parameters | Target | Actual | Remarks | Name Date |
|---|---|---|---|---|---|---|---|
| 20 | Aluminum etch stop and hard mask deposition | | | | | | |
| 20.1 | Etch stop al coating | Z11/EVA760 | 250 mm height prog AL 160? | 2 um | | | |
| 20.2 | Hard mask al coating | Z11/EVA760 | 250 mm height prog AL 160? | 300 nm | | | |
| 21 | Photolithography - Cantilever definition | | | | | | |
| 21.1 | Surface activation | Z6/Heraus | 150 deg C. 15 min | | | Or alternate thermal dehydration | |
| 21.2 | Spin on | Z13/SSE SB20 | AZ9260, STD-1200-RPM | 12 um | | dispense resist over all wafer | |
| 21.3 | PR bake | Z13/SSE SB20 | 115° C. on hotplate | 6 min | | | |
| 21.4 | Rehydration delay | Z13/wafer carrier | 1 h delay in ambient | | | | |
| 21.5 | Expose | Z13/MJB4 | Hard contact, CH1 mode, 1900 mJ/cm$^2$ | 95 sec | | 20 mW/cm$^2$ i-line | |
| 21.6 | PR develop | Z13/Develop bench | AZ developer full conc. | 5 min? | | photolitho params to be refined | |
| 21.7 | DI Rinse | Z13/Develop bench | 3 fill-exchanges | | | careful with fragile membrane | |
| 21.8 | air dry | Z13/Develop bench | | | | dry overnight ideally | |
| 21.9 | Inspection | Z13/microscope | | | | | |
| 22 | Dry etch - sandwich | | | | | | |
| 22.1 | Al dry etch | Z2/STS | Al_etch | 300 nm (~1 min) | | Use EPD, signal difficult to see. Also observe visually | |
| 22.2 | Oxide + nitride dry etch | Z2/STS | Oxyde | 400nm/ 200 nm | | Use EPD, signal difficult to see. Also observe visually | |
| 22.3 | parylene dry etch | Z2/STS | pyralin | 4 um | | Use EPD, signal difficult to see. Also observe visually | |
| 22.4 | Nitride dry etch | Z2/STS | Oxyde | 200 nm | | Use EPD, signal difficult to see. Also observe visually | |
| 23 | Resist strip | | | | | | |
| 23.1 | 1165 | Z2/UFT resist | 5 min bath 1, 5 min bath 2, QDR, TT | 12 um | | | |
| 23.2 | Air dry | Z2/UFT resist | | | | | |
| 23.3 | Inspection | Z2/Visual | Visual inspection for resist residue | | | | |
| 24 | Aluminum wet etch | | | | | | |
| 24.1 | Alu wet etch | Z2/Plade metal or Z14/Arias acid | ANP 35 degrees | 2 um | | | |
| 24.2 | DI rinse | Z2/Plade metal or Z14/Arias acid | TT only, or manual beaker rinse | 3 times | | | |
| 24.3 | Air dry | Z2/Plade metal or Z14/Arias acid | | | | no need for extensive drying | |
| 25 | Oxide strip - tip wafer | | | | | | |
| 25.1 | BHF oxide etch | Z2/Plade oxide or Z14/Arias acid | BHF contaminated | 400 nm | | perform 50% overetch | |
| 25.2 | DI rinse | Z2/Plade oxide or Z14/Arias acid | 3 fill-exchanges | | | | |
| 25.3 | Air dry | Z2/Plade oxide or Z14/Arias acid | | | | dry overnight | |
| 25 | Metal reflective coating deposition | | | | | | |
| 25.1 | Ti/Au evap | Z11/EVA760 | 450 mm height Ti/Al for liftoff | 5 nm/30 nm | | | |

What is claimed is:

1. A microfabricated Cantilever comprising:
a body,
an elongated beam attached to the body, wherein the elongated beam includes:
a first layer comprising a first material,
a second layer comprising a second material having an elastic modulus different to that of the first material,
a third layer comprising a third material having an elastic modulus different to that of the first material,
the first layer being sandwiched between the second layer and the third layer,
wherein inherent or intrinsic material damping of the first material dominates a response time of the cantilever, or the first material has an elastic modulus inferior to that of the second and third material.

2. The cantilever according to claim 1, wherein the first material is or compromises a polymer.

3. Cantilever according to claim 1, wherein the first material is a viscoelastic material.

4. The cantilever according to claim 1, wherein the second layer and the third layer have a smaller layer thickness that that of the first layer.

5. The cantilever according to claim 1, further including an optically reflective layer for determining movement of the cantilever.

6. The cantilever according to claim 1, wherein the optically reflective layer is deposited on the first layer.

7. The cantilever according to claim 4, wherein the optically reflective layer is sandwiched between the first layer and the second layer.

8. The cantilever according to claim 1, wherein the beam includes a sensing tip formed by the second layer, or formed of a material different to that of the second and third layers.

9. The cantilever according to claim 1, wherein the beam further includes a sensing element to detect the deflection of the beam.

10. The cantilever according to claim 1, wherein the cantilever further includes a first and a second metal layer sandwiching the sensing element to measure a deflection of the beam.

11. The cantilever according to claim 9, wherein the cantilever further includes a first metal layer contacting a first portion of the sensing element and a second metal layer contacting a second portion of the sensing element to measure a deflection of the beam.

12. The cantilever according to claim 1, wherein the sensing element and the first and second metal layers are attached to an inner surface of the third layer, or wherein the sensing element and the first and second metal layers are attached to an outer surface of the second layer.

13. The cantilever according to claim 7, wherein the sensing tip is attached to or is integrated into or integral with the second layer.

14. The cantilever according to claim 1, wherein the first layer (3) includes a microfluidic channel.

15. An atomic force microscope, molecule detector, biosensor or multi-cantilever array including at least one cantilever according to claim 1.

16. A method for producing a cantilever or membrane comprising the steps of:
providing a first wafer including a first layer deposited on a first external surface of the wafer and a second layer deposited on a second external surface of the wafer;
providing a second wafer including a first layer deposited on a first external surface of the wafer and a second layer deposited on a second external surface of the wafer;
forming a first structure by depositing a third layer comprising a material having an elastic modulus inferior to that of the first and second layer on the first layer of the first wafer;
forming a second structure by depositing a third layer comprising a material having an elastic modulus inferior to that of the first and second layer on the first layer of the second wafer;
wafer bonding the first and second structures together by combining the third layer of the first structure with the third layer of the second structure,
partially removing the exposed second layer on a first external surface of the bonded structure to expose the first wafer material and create a first etch mask window, and partially removing the exposed second layer on a second external surface of the bonded structure to expose the second wafer material and create a second etch mask window;
etching the exposed first wafer material and the exposed second wafer material to remove part of the first and second wafer material and expose a beam including the combined third sandwiched between the first layers;
depositing an etch stop and support layer on the second wafer material and the first layer of the second wafer;
etching through the beam to divide the bean in two parts; and
removing the etch stop and support layer.

17. An AFM cantilever comprising:
a body,
an elongated beam attached to the body,
wherein the elongated beam includes:
a first layer comprising a first material,
a second layer comprising a second material having an elastic modulus different to that of the first material,
a third layer comprising a third material having an elastic modulus different to that of the first material,
the first layer being sandwiched between the second layer and the third layer,
wherein inherent or intrinsic material damping of the first material dominates a response time of the cantilever, or the first material has an elastic modulus inferior to that of the second and third material.

* * * * *